(12) United States Patent
Lee et al.

(10) Patent No.: US 9,488,701 B2
(45) Date of Patent: Nov. 8, 2016

(54) INTEGRATED MAGNATORESISTIVE SENSING DEVICE

(71) Applicant: Voltafield Technology Corp., Zhubei, Hsinchu County (TW)

(72) Inventors: Chien-Min Lee, Hsinchu County (TW); Nai-Chung Fu, Zhubei (TW); Kuang-Ching Chen, Changhua County (TW)

(73) Assignee: Voltafield Technology Corp., Zhubei (TW)

( * ) Notice: Subject to any disclaimer, the term of this patent is extended or adjusted under 35 U.S.C. 154(b) by 706 days.

(21) Appl. No.: 13/773,560

(22) Filed: Feb. 21, 2013

(65) Prior Publication Data
US 2014/0132250 A1 May 15, 2014

(30) Foreign Application Priority Data
Nov. 12, 2012 (TW) .............................. 101141959 A

(51) Int. Cl.
*G01R 33/09* (2006.01)
(52) U.S. Cl.
CPC .................................. *G01R 33/093* (2013.01)
(58) Field of Classification Search
CPC ....................................................... G01R 33/09
USPC ........................................................... 324/252
See application file for complete search history.

(56) References Cited

U.S. PATENT DOCUMENTS

2013/0320972 A1* 12/2013 Loreit et al. .................. 324/252

FOREIGN PATENT DOCUMENTS

WO    WO 2012103950 A1 *  8/2012

* cited by examiner

*Primary Examiner* — Bot Ledynh
(74) *Attorney, Agent, or Firm* — Alan D. Kamrath; Kamrath IP Lawfirm, P.A.

(57) ABSTRACT

An integrated magnetoresistive sensing device includes a substrate, a magnetoresistive sensing element and a built-in self test (BIST) unit. The substrate comprises a first surface and a second surface opposite to the first surface. The magnetoresistive sensing element is disposed above the first surface and comprises at least a magnetoresistive layer not parallel to the first surface. The BIST unit is disposed above the first surface and comprises at least a conductive part corresponding to the magnetoresistive layer. The conductive part is configured to generate a magnetic field along a direction perpendicular to the first surface. A projection of the conductive part on the first surface does not overlap with a projection of the magnetoresistive layer on the first surface.

25 Claims, 21 Drawing Sheets

INTEGRATED MAGNATORESISTIVE SENSING DEVICE

FIELD OF THE INVENTION

The present invention relates to a magnetoresistive sensing device and particularly to a magnetoresistive sensing device with a built-in self testing (BIST) unit.

BACKGROUND OF THE INVENTION

The magnetoresistive materials used in a magnetoresistive sensing device would change its resistance due to the presence of magnetic field and they are widely applied in various industries such as sport products, vehicles, motors, communication devices, etc. Commonly used magnetoresistive materials can be classified into three categories: anisotropic magnetoresistance (AMR), giant magnetoresistance (GMR) and tunneling magnetoresistance (TMR), based on how they work and how sensitive they are.

In general, the magnetic field change to be measured by the magnetoresistive sensing device is very small and it can not be measured accurately without proper testing, setting and calibration done to the magnetoresistive sensing device. However, the trend of continuing miniaturization of device and complexity of package would make testing, setting and calibration more difficult, so a built-in self test unit is required to solve this problem.

SUMMARY OF THE INVENTION

A purpose of this invention is to provide an integrated magnetoresistive device with a built-in self test unit to satisfy the trend of continuing miniaturization of device and complexity of package.

This invention discloses an integrated magnetoresistive device which includes a substrate, a magnetoresistive sensing element and a built-in self test (BIST) unit. The substrate comprises a first surface and a second surface opposite to the first surface. The magnetoresistive sensing element is disposed above the first surface and comprises at least a magnetoresistive layer not parallel to the first surface. The BIST unit is disposed above the first surface and comprises at least a conductive part corresponding to the magnetoresistive layer. The conductive part is configured to generate a magnetic field along a direction perpendicular to the first surface. A projection of the conductive part on the first surface does not overlap with a projection of the magnetoresistive layer on the first surface.

In one embodiment, the magnetoresistive layer has a first extension portion or a first extension and a second extension portions.

In one embodiment, a length of the first extension portion parallel to the first surface is substantially equivalent to or greater than or smaller than a length of the magnetoresistive layer.

In one embodiment, a plurality of conductive strips not parallel to the first extension portion is physically connected to the first extension portion from above or below.

In one embodiment, a distance between the first extension portion and the first surface is greater than a distance between the second extension portion and the first surface.

In one embodiment, the magnetoresistive layer and the conductive part constitute a magnetoresistive sensing cell, a plurality of magnetoresistive sensing cells constitute an array, and the conductive parts within this array are connected in parallel.

In one embodiment, a plurality of magnetoresistive sensing cells with different orientations constitute an array, and the conductive parts within this array are connected in serial.

In one embodiment, the magnetoresistive sensing element has a Wheatstone bridge configuration and the Wheatstone bridge configuration has four resistive arms.

In one embodiment, the built-in self test unit has at least four U-shaped sub-units, these four U-shaped sub-units correspond to the four resistive arms respectively.

In one embodiment, the built-in self test unit has at least one grating and the resistive arms are surrounded by a frame of the grating.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 6a illustrates a magnetoresistive sensing portion 800' formed by connecting multiple magnetoresistive sensing portion 800" by one magnetoresistive layer 300;

DETAILED DESCRIPTION OF PREFERRED EMBODIMENTS

Figure 1:
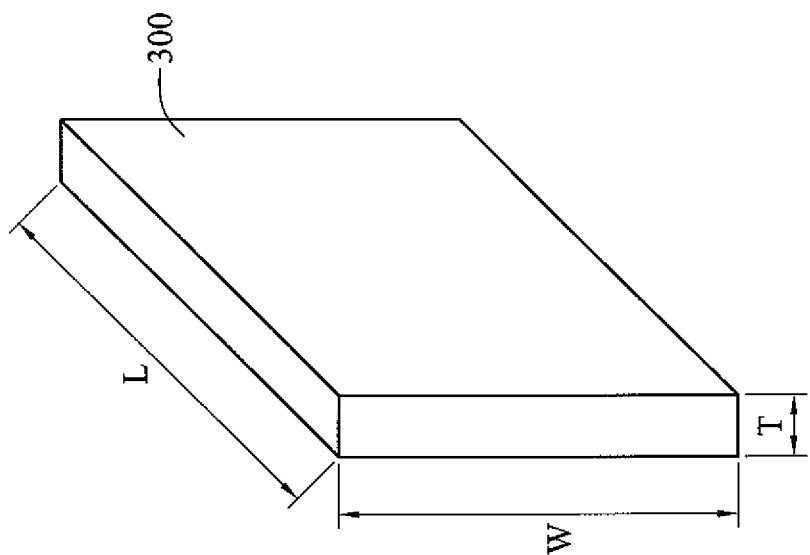
FIG. 1 is a 3-D view of a magnetoresistance layer of a Z-axis magnetoresistive sensing element in accordance with an embodiment of the present invention.

The present invention focuses on an integrated magnetoresistive sensing device with a magnetoresistive sensing element capable of sensing Z-axis magnetic field and a built-in self test unit. However, this integrated magnetoresistive sensing device may further comprise other commonly used structures or, elements such as set/reset circuit, another magnetoresistive sensing element capable of sensing X/Y-axis magnetic field, various circuitry comprising amplifiers, filters, converters, shields, etc. To clearly illustrate this invention and not to obscure its focus, the descriptions of these commonly used structures or elements are omitted, but it does not mean the integrated magnetoresistive sensing device of the present invention can not optionally comprise these structures or elements.

The following is the detailed description of the preferred embodiments of this invention. All the elements, sub-elements, structures, materials, topology recited herein can be combined in any way and in any order into new embodiments, and these new embodiments should fall in the scope of this invention defined by the appended claims. A person skilled in the art, upon reading this invention, should be able to modify and change the elements, sub-elements, structures, materials, topology recited herein without being apart from the principle and spirit of this invention. Therefore, these modifications and changes should fall in the scope of this invention defined only by the following claims.

There are a lot of embodiments and figures in this application. To avoid confusion, similar components are represented by same or similar numerals. To avoid complexity and confusion, only one of the repetitive components is marked. Figures are meant to deliver the principle and spirits of this invention, so the distance, size, ratio, shape, connection relationship, etc. are examples instead of realities. Other distance, size, ratio, shape, connection relationship, etc. capable of achieving the same functions or results can be adopted as equivalents.

In this specification, the terms "magnetoresistive layer" or "the (first or second) extension portion of the magnetoresistive layer" or "magnetoresistive material" all mean a single or multiple discrete or continuous film/stacked films whose resistance would change due to an external magnetic field along a specific direction. They can comprise anisotropic magnetoresistance (AMR), giant magnetoresistance (GMR), and tunneling magnetoresistance (TMR) materials, such as ferromagnet material, antiferromagnet material, non-ferromagnet material, tunneling oxide, or any combination thereof. The terms "magnetoresistive layer" or "the (first or second) extension portion of the magnetoresistive layer" or "magnetoresistive material" preferably comprise anisotropic magnetoresistance (AMR) materials especially permalloy. In this specification, the terms "conductor", "conductive part", "conductive strip" or "interconnect" all mean a conductive structure without shape limitation. They can comprise metal, alloy, salicide, nanotube, conductive carbon material, doped silicon, etc. They can have the following structures: strip, discrete island, sheet, through via, single or dual damascene structure, or a combination thereof along vertical or horizontal direction. In this specification, the terms "magnetic field" and "magnetic field along a specific direction" can represent the net magnetic field at a specific location or the magnetic field from a specific source at a specific location without considering other sources. In this specification, the terms "cell", "array", "unit" and "sub-unit" suggest how things are arranged or how things are grouped together or certain hierarchy relationship between different things but they suggest no such concept of single or plurality.

Figure 1A:
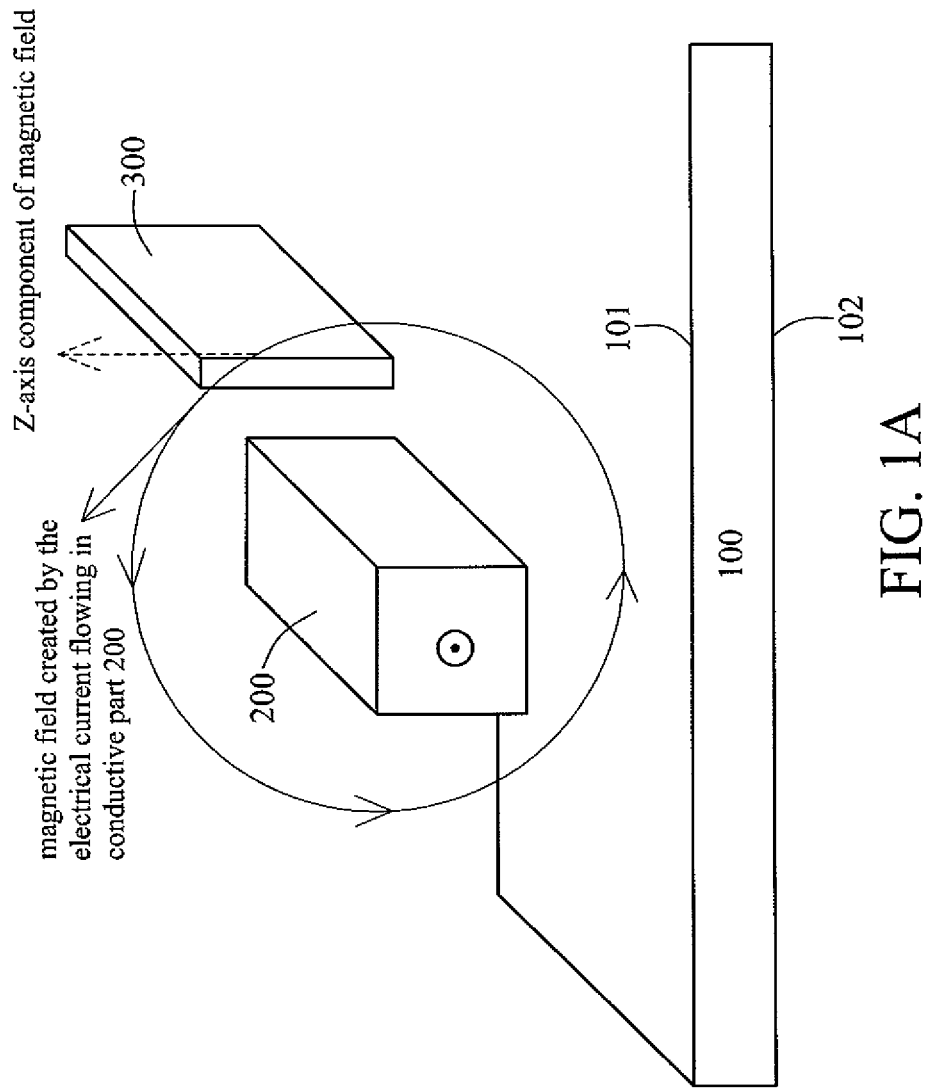
FIG. 1A is a schematic view of a Z-axis magnetoresistive sensing cell in accordance with an embodiment of the present invention.
Figure 1B:
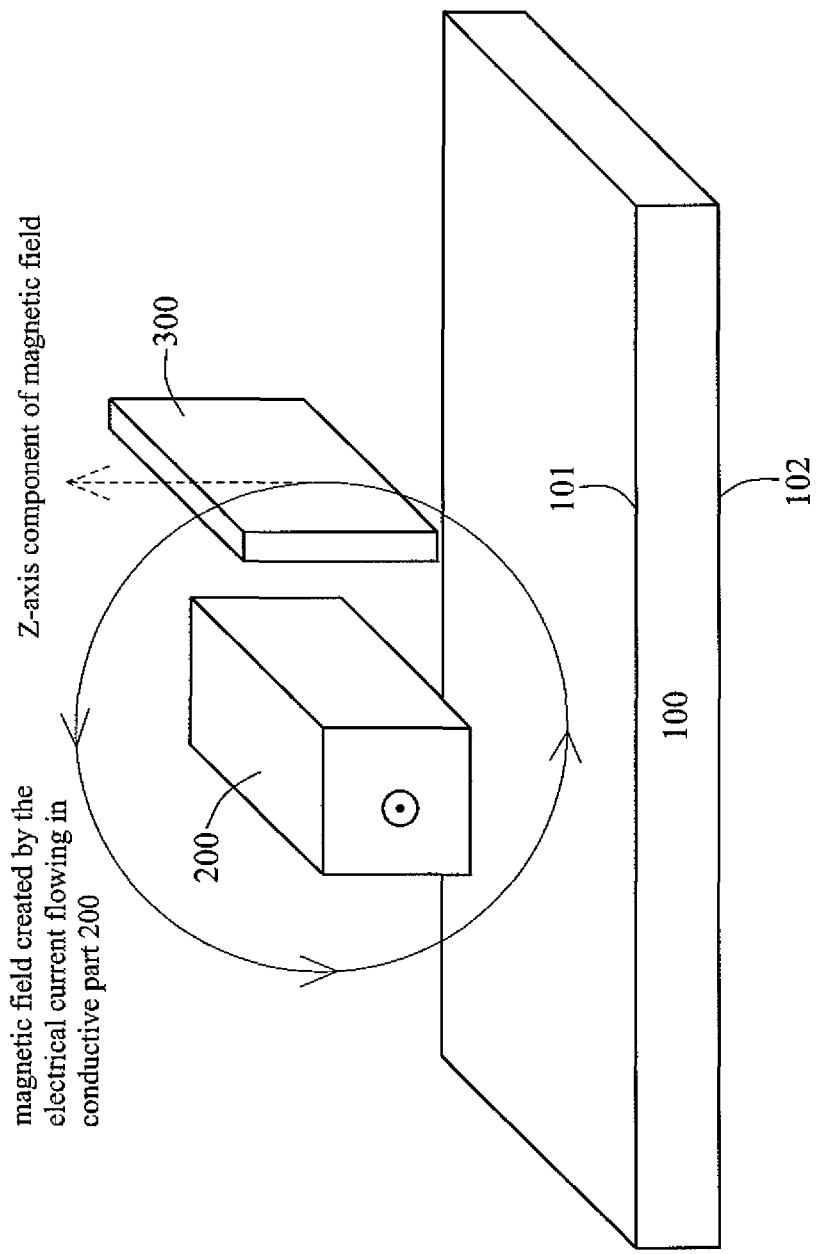
FIG. 1B is a schematic view of a Z-axis magnetoresistive sensing cell in accordance with another embodiment of the present invention.
Figure 1C:
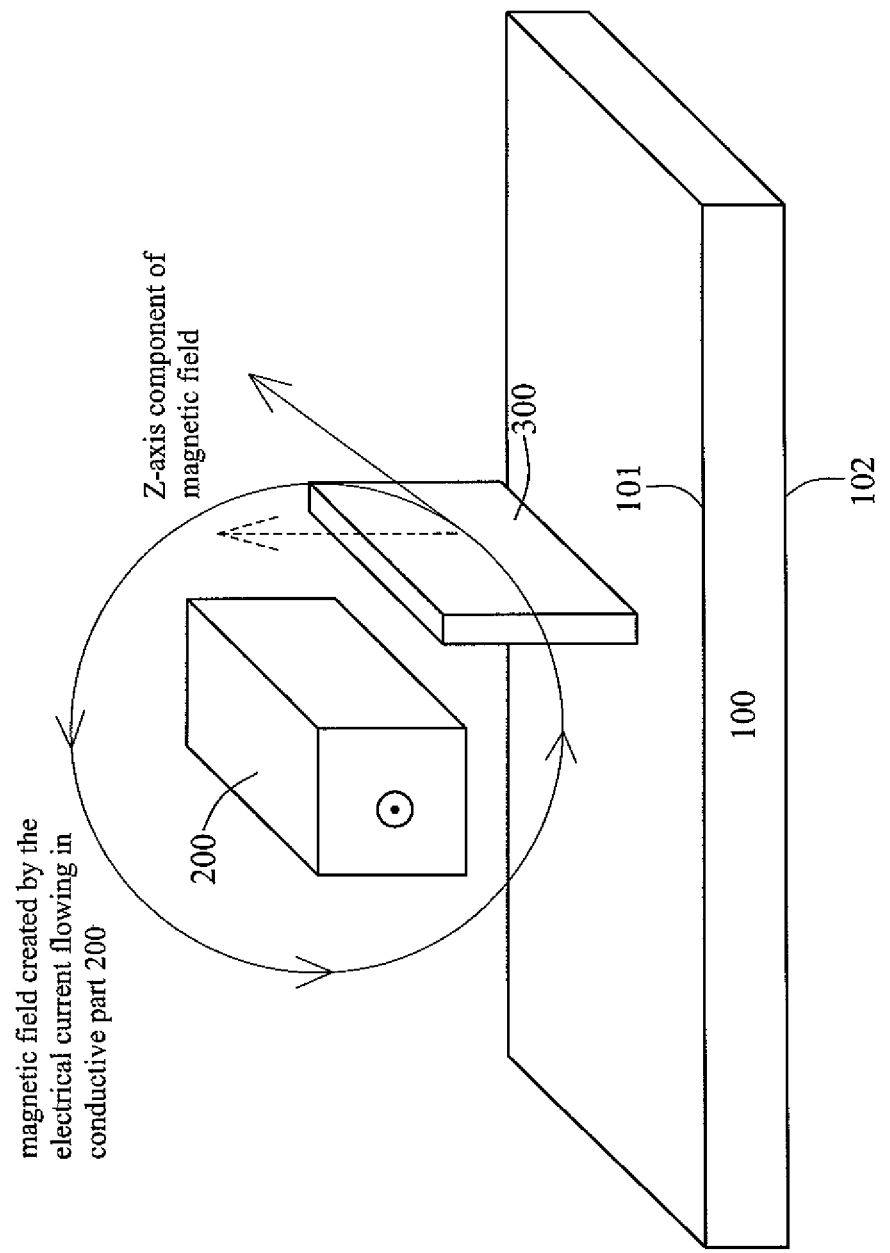
FIG. 1C is a schematic view of a Z-axis magnetoresistive sensing cell in accordance with yet another embodiment of the present invention.

Now refer to FIG. 1 and FIG. 1A-1C, FIG. 1 is a 3-D view of the magnetoresistive layer 300 of a Z-axis magnetoresistive sensing element in accordance with an embodiment of the present invention and FIGS. 1A-1C are schematic views of Z-axis magnetoresistive sensing cells in accordance with different embodiments of the present invention. FIG. 1 focuses on the shape and orientation of the magnetoresistive layer 300 while FIGS. 1A-1C focus the relative relationship between the magnetoresistive layer 300 and others around it. The magnetoresistive layer 300 is one of many magnetoresistance layers in the Z-axis magnetoresistive sensing element, it is disposed above substrate 100 and it has thickness T, width W and length L. In this embodiment, the width W and length L of magnetoresistive layer 300 is much greater than its thickness T, but in some situations the length L is not necessarily greater than the width W. The magnetoresistive layer 300 is characterized that a direction of its width W is not parallel to the first surface 101 of substrate 100. The direction of the width W is preferably perpendicular the first surface 101 of substrate 100. However, due to deviations caused by a manufacturing process or a design need, the width W forms an obtuse angle or an acute angle with respect to the first surface 101. Conductive part 200 is a part of the built-in self test unit. The conductive part 200 is corresponding to the magnetoresistive layer 300 and at the periphery of magnetoresistive layer 300. The conductive part 200 is configured to conduct electrical current so as to produce a magnetic field component perpendicular to first surface 101 (referred to as a Z-axis magnetic field component). In FIG. 1A-1C, the current flowing in conductive part 200 flows along a direction straight out of paper, thereby producing a counterclockwise magnetic field. The Z-axis magnetic component of this counterclockwise magnetic field can be sensed by the nearby magnetoresistive layer 300 and results in the resistance change of the magnetoresistive layer 300, so a change on the output signal occurs. The difference between FIGS. 1A through 1C lays on the relative relationship between the magnetoresistive layer 300 and the conductive part 200. In FIG. 1A, the magnetoresistive layer 300 is slightly higher than the conductive part 200, that is, the magnetoresistive layer 300 is above the conductive part 200. In FIG. 1B, the magnetoresistive layer 300 and the conductive part 200 are substantially at the same level. In FIG. 1C, the magnetoresistive layer 300 is slightly lower than the conductive part 200, that is, the magnetoresistive layer 300 is below the conductive part 200. However, it should be noted that the magnetoresistive layer 300 should not be right beneath or right above the conductive part 200 otherwise the magnetoresistive layer 300 would sense no Z-axis magnetic field component due to no Z-axis magnetic field component is produced right beneath or right above the conductive part 200. Although in FIG. 1A-1C, the magnetoresistive layer 300 has thin plate shape while the conductive part 200 has strip shape and they have similar lengths, their shapes, cross sectional sizes, lengths are not limited thereto. For example, a length of the conductive part 200 can be much greater than a length of the magnetoresistive layer 300 so the conductive part 200 can correspond to more than one magnetoresistive layer 300 or may be used as a part of interconnects. Furthermore, the term "at the same level" does not mean they have the same widths and completely align with each other. It rather means the smaller one's top edge is not higher than the bigger one's top edge and the smaller one's bottom edge is not lower than the bigger one's bottom edge. Even though not shown in the figures, the magnetoresistive layer 300 and the conductive part 200 are disposed in a dielectric material/materials and surrounded by the dielectric material/materials to be electrically isolated from each other.

Figure 2:
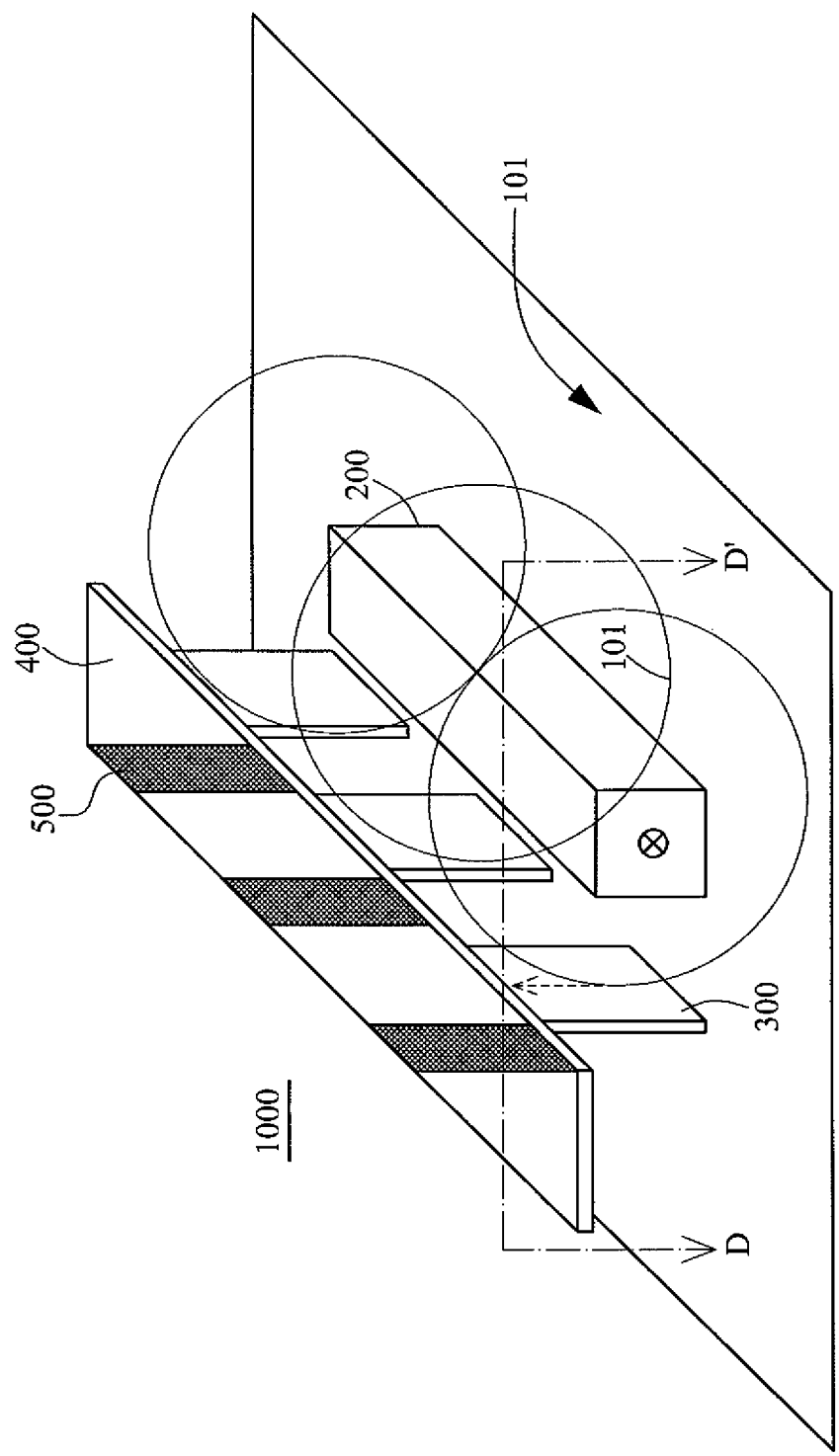
FIG. 2 is a detailed view of a Z-axis magnetoresistive sensing cell in accordance with an embodiment of the present invention.
Figure 2A:
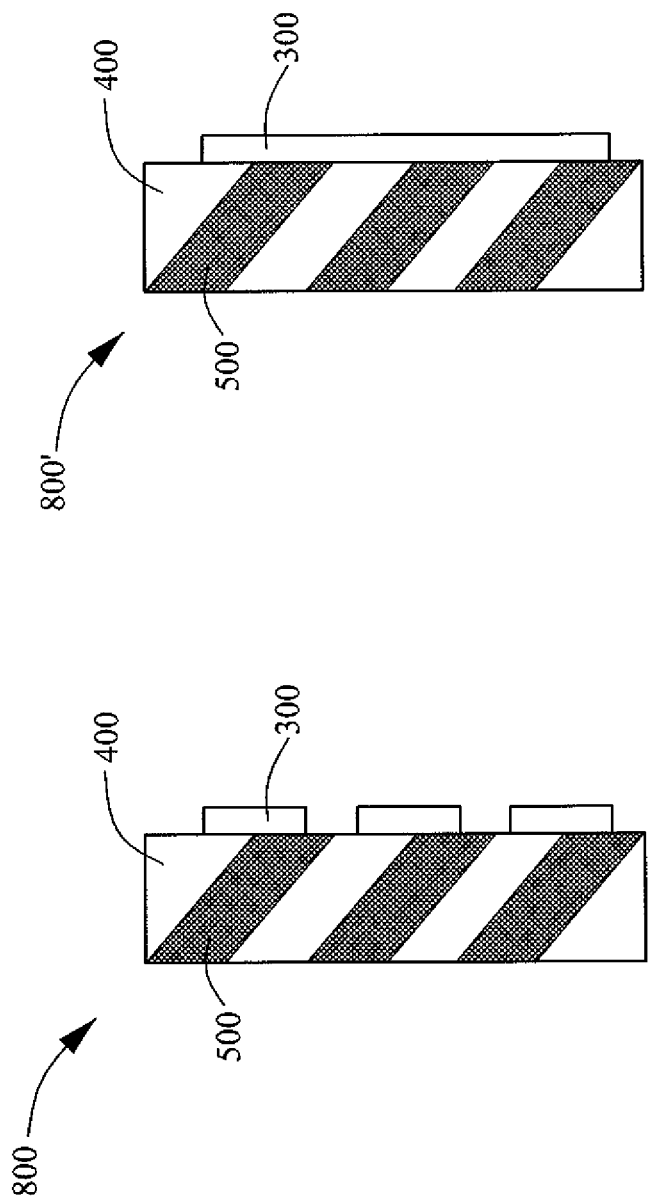
FIG. 2A is a top view of the magnetoresistive sensing portion of the Z-axis magnetoresistive sensing cell in accordance with an embodiment of the present invention shown in FIG. 2.

Please refer to FIGS. 2 and 2A. FIG. 2 is the detailed figure illustrating the Z-axis magnetoresistive sensing cell 1000 according to an embodiment of this invention and FIG. 2A is the top view of Z-axis magnetoresistive sensing portion 800 of the magnetoresistive sensing cell 1000 shown in FIG. 2. As shown in FIG. 2, the Z-axis magnetoresistive sensing cell 1000 comprises the magnetoresistive layer 300 and the conductive part 200 shown in FIGS. 1A-1C and further comprises a first extension portion 400 of the magnetoresistive layer 300 (hereafter referred to as first extension portion 400) and conductive strips 500 (barber pole) physically connected to the first extension portion 400. In one embodiment of this invention, the magnetoresistive layer 300 the first extension portion 400 and the conductive strips 500 constitute the Z-axis magnetoresistive sensing portion 800 shown in FIG. 2A. The magnetoresistive layer 300 and the first extension portion 400 may be formed by the same magnetoresistive material into one structure or they may be formed by the same or different magnetoresistive materials into physically connected discrete structures. The magnetoresistive layer 300 is not parallel to the first surface 101 while the first extension portion 400 is substantially parallel to the first surface 101. As stated earlier, the primary function of the magnetoresistive layer 300 is to sense a Z-axis magnetic field component perpendicular to the first surface 101. In this embodiment, since the magnetoresistive layer 300 is in physical contact with the first extension portion 400, the Z-axis magnetic field component sensed by the magnetoresistive layer 300 can be redirected (or guided) so as to influence the first extension portion 400, thereby resulting in a change of the combined resistance of the magnetoresistive layer 300 and first extension portion 400. The conductive strips 500 not parallel to the first extension portion 400 are disposed above or below the first extension portion 400 and in electrical contact therewith to serve as a shunt to change a direction of the current flowing in the first extension portion 400, so the current conducting direction in the first extension portion 400 not in contact with the conductive strips 500 forms an angle (preferably 45 degree) with respect to a direction of the magnetization of the first extension portion 400. Therefore a direction of the length (referred to as length direction) of the conductive strips 500 also preferably forms a 45 degree angle with respect to the length direction of the first extension portion 400. In this embodiment, the current flowing in the conductive part 200 flows straight into the paper surface so as to create a clockwise magnetic field, a Z-axis component of this magnetic field would be sensed by a magnetoresistive layer 300 close to the conductive part 200, thereby resulting in a change of the combined resistance of the magnetoresistive layer 300 and first extension portion 400 hence a change on the output. In this embodiment, multiple magnetoresistive layers 300 are disposed along one side of the first extension portion 400 in a predetermined pitch, so the length of the magnetoresistive layer 300 is much smaller than the length of the first extension portion 400. One conductive part 200 corresponds to these multiple magnetoresistive layers 300, so the length of the conductive part 200 is much greater than the length of each of these magnetoresistive layers 300 but may be substantially equivalent to the length of the first extension portion 400. However, as shown in the Z-axis magnetoresistive sensing portion 800' of FIG. 2A, these discrete magnetoresistive layers 300 can be merged into one continuous magnetoresistive layer 300 while achieving the same function.

Figure 2B:
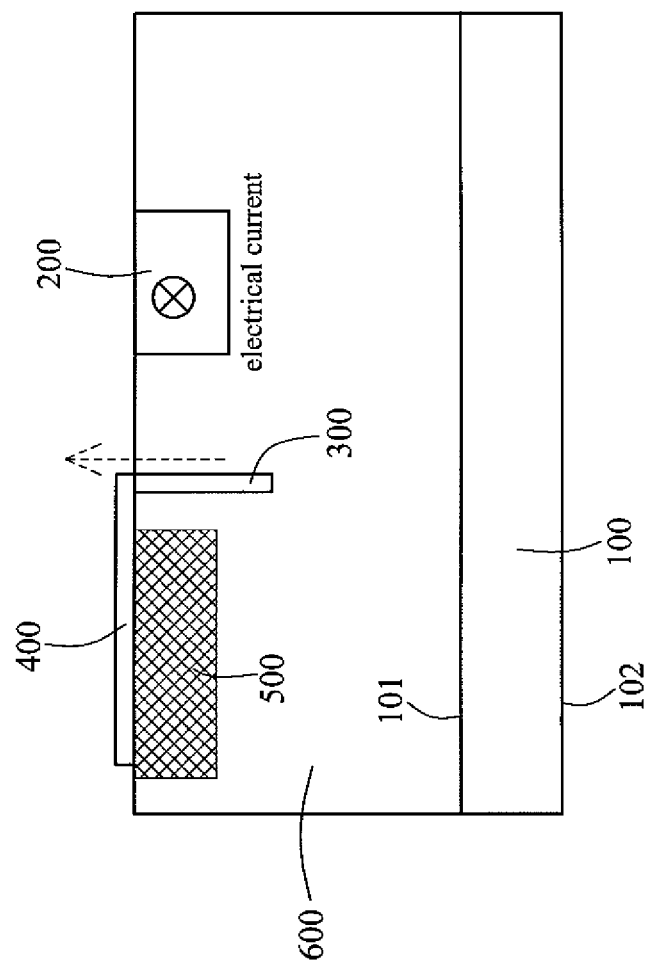
FIG. 2B is a cross sectional view of a Z-axis magnetoresistive sensing cell in accordance with an embodiment of the present invention.
Figure 2C:
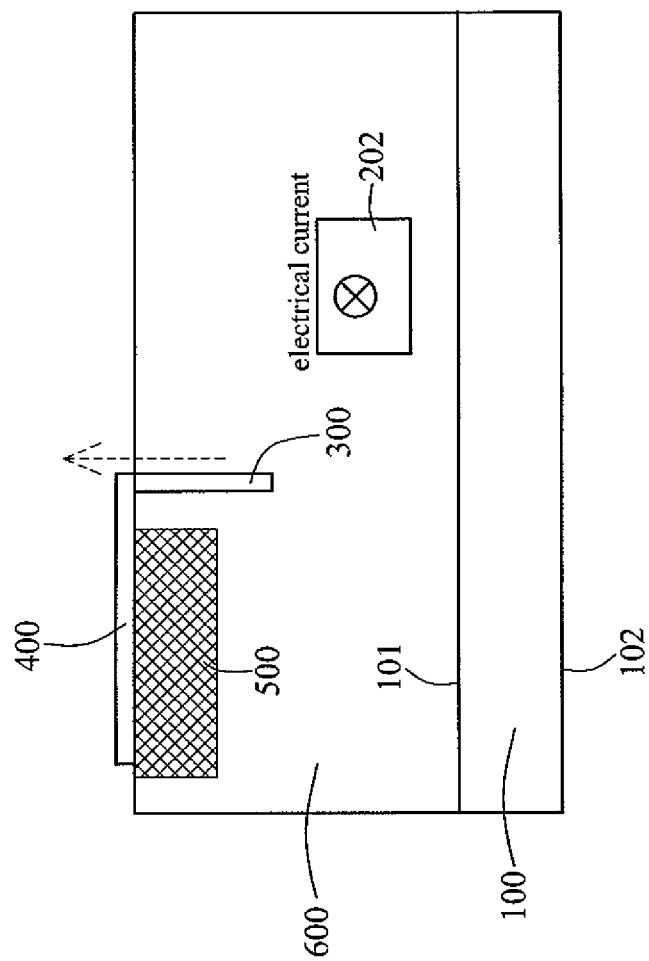
FIG. 2C is a cross sectional view of a Z-axis magnetoresistive sensing cell in accordance with another embodiment of the present invention.
Figure 2D:
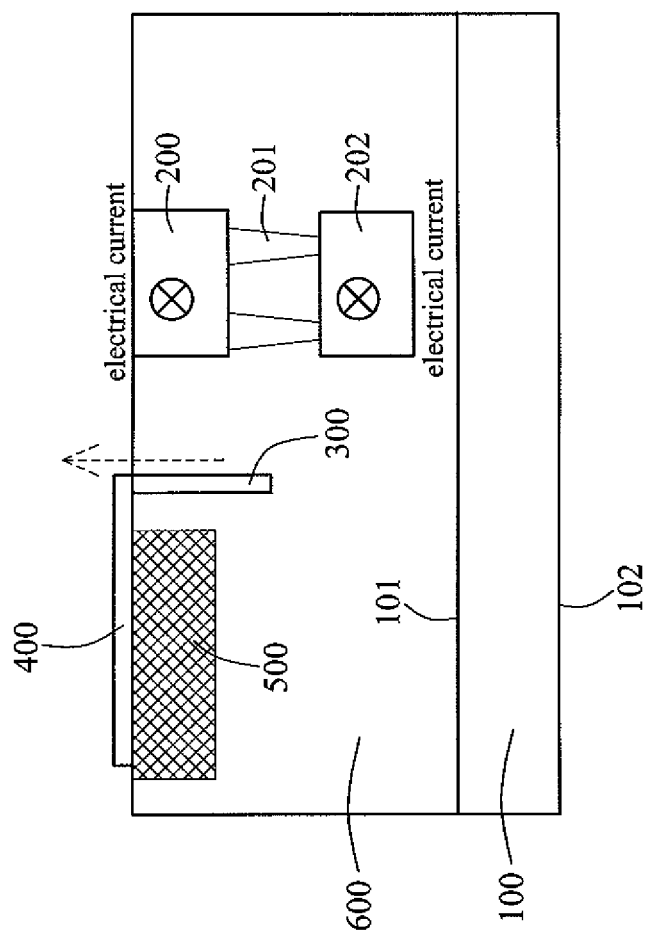
FIG. 2D is a cross sectional view of a Z-axis magnetoresistive sensing cell in accordance with yet another embodiment of the present invention.

Then please refer to FIGS. 2B-2D. FIGS. 2B-2D are cross sectional figures illustrating Z-axis magnetoresistive sensing cell 1000 according to different embodiments of this invention taken along cutting line D-D'. In FIGS. 2B-2D, although conductive strips 500 are disposed below the first extension portion 400, they may be disposed above the first extension portion 400; although the magnetoresistive layer 300 and the first extension portion 400 are formed into one structure, they can be physically connected discrete structures; although the magnetoresistive layer 300, the conductive part 200 and the conductive strips 500 are disposed within a dielectric layer 600 above the substrate 100 while the first extension portion 400 is disposed on the dielectric layer 600, there may be more dielectric layers covering and protecting the first extension portion 400 and other devices or circuitry. Dielectric layer 600 can be a single-layered or multiple-layered structure of the same material or different materials. In FIG. 2B, the conductive part 200 is substantially at the same level with the Z-axis magnetoresistive sensing portion 800. In FIG. 2C, the conductive part 202 is slightly below the Z-axis magnetoresistive sensing portion 800. In FIG. 2D, the conductive part 200 combines with the conductive part 202 slightly below the Z-axis magnetoresistive sensing portion 800 together to become a magnetic field generating source and the conductive part 200 and the conductive part 202 are electrically connected by the conductive contact/via 201. The conductive part 200, conductive part 202 and conductive contact/via 201 may be formed into one structure or physically connected discrete structures of the same material or different materials.

Figure 3:
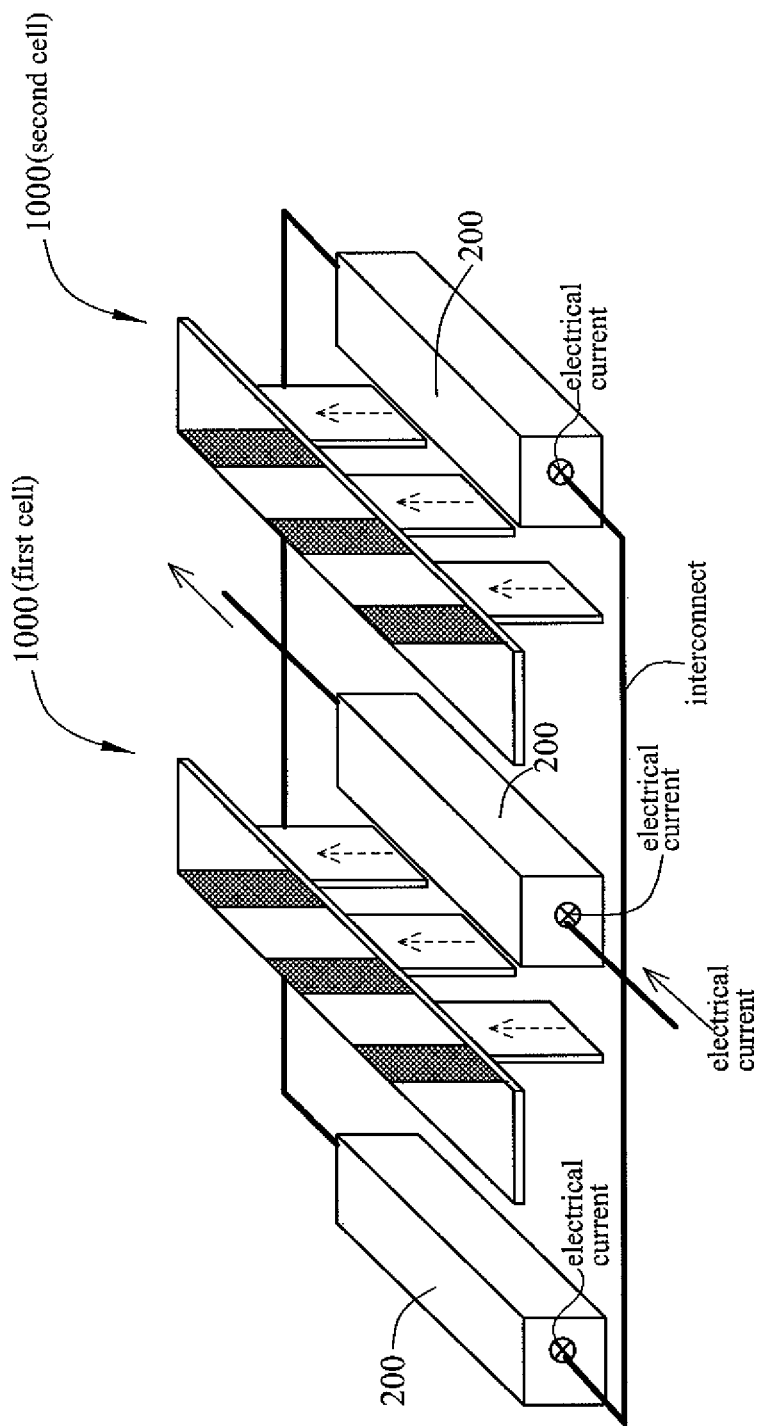
FIG. 3 illustrates a Z-axis magnetoresistive sensing array in accordance with an embodiment of the present invention, wherein the conductive parts of the built-in self test unit are connected in parallel.

FIG. 3 illustrates an array composed of several Z-axis magnetoresistive sensing cells 1000 according to one embodiment of this invention, wherein the conductive parts 200 of the built-in self test unit are electrically connected in parallel. In this embodiment, two Z-axis magnetoresistive sensing cells 1000 are juxtaposed parallel to the first surface 101, in each Z-axis magnetoresistive sensing cell 1000 the conductive part 200 is at the side close to the magnetoresistive layer 300 and different conductive parts 200 are parallelly connected by interconnect so electrical currents in all the conductive parts 200 flow along the same direction (in this embodiment the electrical currents flow along a direction straight into paper). In the array of FIG. 3, the left most unpaired conductive part 200 is used to illustrate that this array may have more than two Z-axis magnetoresistive sensing cells 1000. In this embodiment it is noted that the middlemost conductive part 200 among all the conductive parts 200 not only create a Z-axis magnetic field component pointing up at its left side but also create a Z-axis magnetic field component pointing down at its right side. The Z-axis magnetic field component pointing up at its left side would affect the Z-axis magnetoresistive sensing portion 800 at its left side and the Z-axis magnetic component pointing down at its right side would affect the Z-axis magnetoresistive sensing portion 800 at its right side. For the Z-axis magnetoresistive sensing portion 800 at its right side, this undesirable influence from the left side of the Z-axis magnetoresistive sensing portion 800 would counteract the desirable influence from the right side of the Z-axis magnetoresistive sensing portion 800, therefore it is better for the Z-axis magnetoresistive sensing portion 800 to stay away from the conductive part 200 at its left side and stay closer to the conductive part 200 at its right side so as to avoid counteractive effect. That is, there should be proper distance between two Z-axis magnetoresistive sensing cells 1000, i.e. the distance between the magnetoresistive sensing portion 800 and conductive part 200 (distance between the magnetoresistive layer 300 and conductive part 200) in the same cell should be smaller than the distance between the magnetoresistive sensing portion 800 and the adjacent conductive part 200 (distance between the magnetoresistive layer 300 and the adjacent conductive part 200) from different cells.

Figure 4:
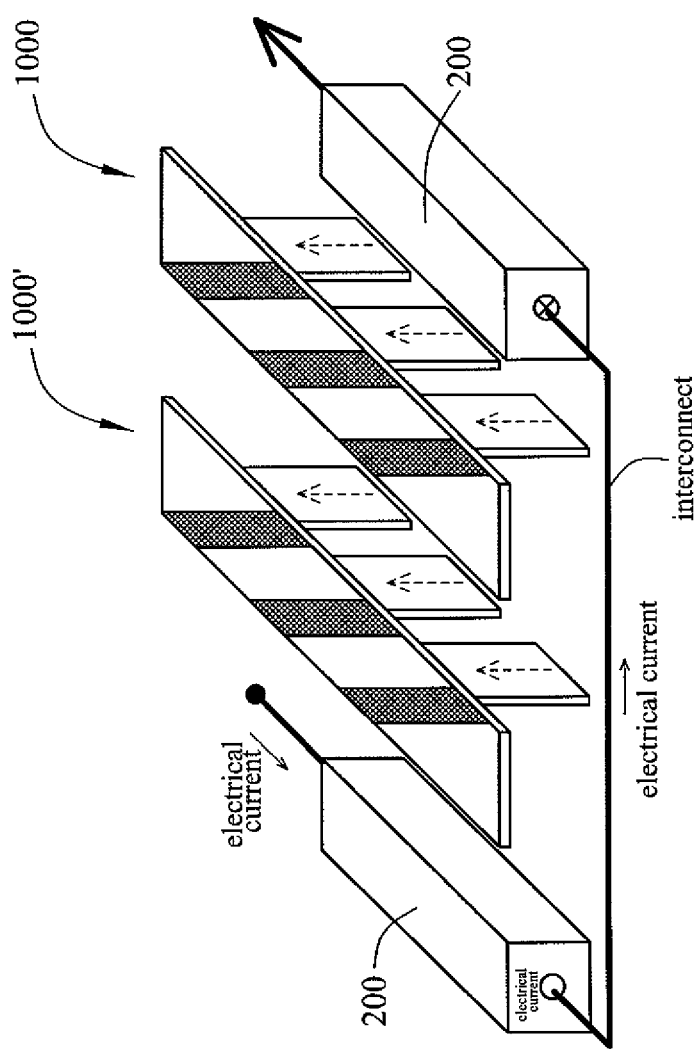
FIG. 4 illustrates a Z-axis magnetoresistive sensing array in accordance with another embodiment of the present invention, wherein the conductive parts of the built-in self test unit are connected in serial.

FIG. 4 illustrates an array composed of the Z-axis magnetoresistive sensing cells 1000 and 1000' according to another embodiment of this invention, wherein the conductive parts 200 of the built-in self test unit are electrically connected in serial. In the embodiment of FIG. 4, the conductive part 200 and magnetoresistive layer 300 are both at the same side of Z-axis magnetoresistive sensing cell 1000 and the electrical current in the conductive part 200 flows straight into paper. However, the conductive part 200 and magnetoresistive layer 300 are at the opposite sides of Z-axis magnetoresistive sensing cell 1000' and the electrical current in the conductive part 200 flows straight out of paper. In this embodiment, the Z-axis magnetoresistive sensing cells 1000 and 1000' are juxtaposed parallel to the first surface 101, and the conductive parts 200 of these two cells are connected in serial by interconnect, the Z-axis magnetic field component generated between the two conductive parts 200 does not suffer counteractive effect.

Even though in FIGS. 3 and 4 no electrical connections are shown to connect two Z-axis magnetoresistive sensing portions 800 together, it does not mean the two Z-axis magnetoresistive sensing portions 800 are not electrically connected. Different Z-axis magnetoresistive sensing portions 800 are usually connected either by some close-by interconnects or by interconnect routing far away, however these interconnects or routing are omitted to simply keep the figure plain and easy to understand. Furthermore, the interconnects marked in FIGS. 3 and 4 to connect the conductive parts 200 together can be the extensions of the conductive parts 200, so a plurality of conductive parts 200 and their extensions are in one structure.

Figure 5:
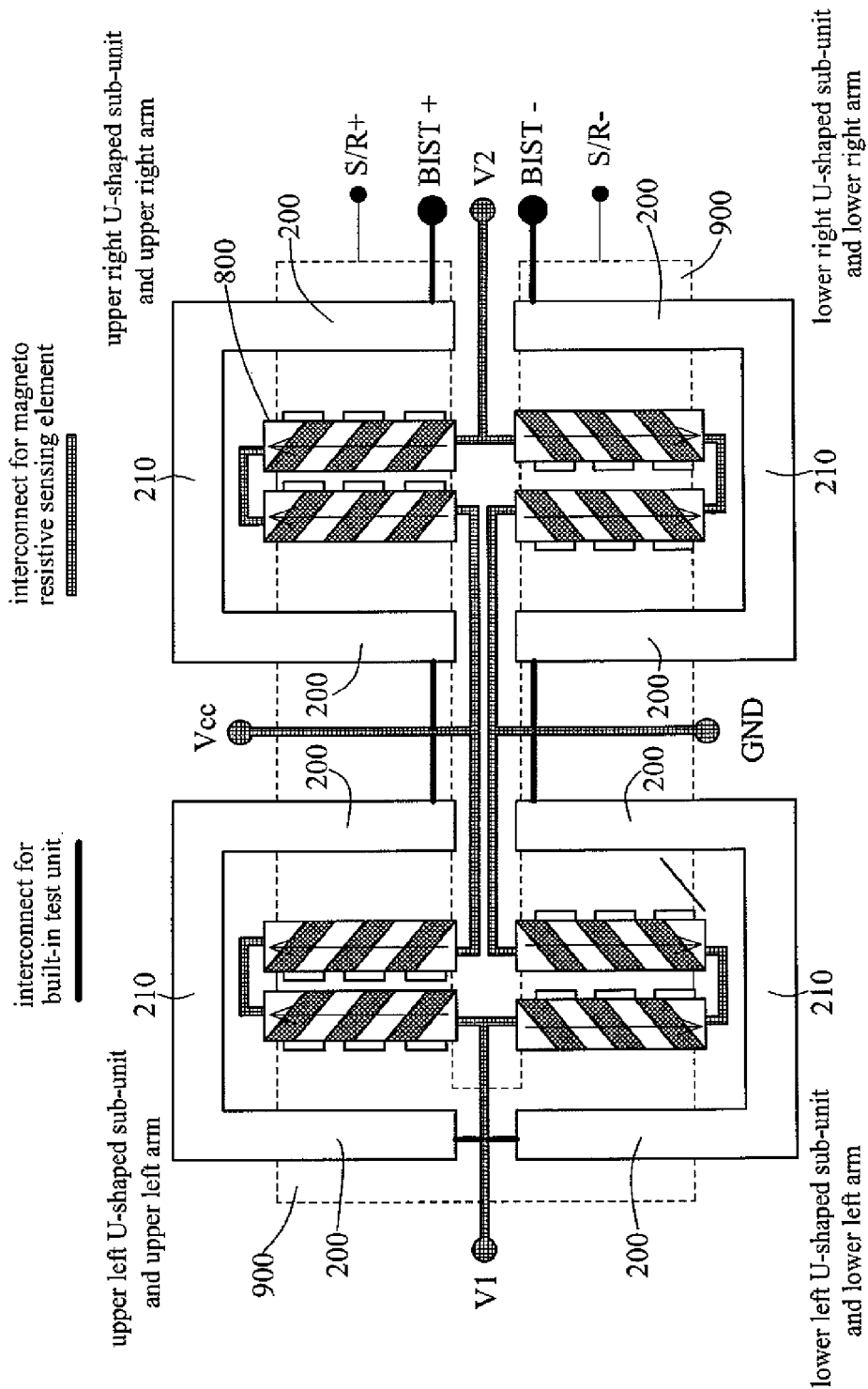
FIG. 5 illustrates the circuit topology of an integrated magnetoresistive sensing device in accordance with an embodiment of the present invention, wherein the integrated magnetoresistive sensing device comprises a magnetoresistive sensing element of Wheatstone bridge configuration and a built-in self test unit (BIST)

FIG. 5 is a circuitry figure illustrating an integrated magnetoresistive sensing device according to one embodiment of this invention, the integrated magnetoresistive sensing device comprises a magnetoresistive sensing element of Wheatstone bridge configuration and a built-in self test unit. In this embodiment, the Wheatstone bridge configuration have at least four resistive arms (upper-right arm, lower-right arm, upper-left arm, and lower-left arm) and each resistive arm is composed of multiple Z-axis magnetoresistive sensing portions 800 electrically connected in series by interconnect (exemplified by two Z-axis magnetoresistive sensing portions 800 connected in series by interconnect). As for the upper-right resistive arm, the left end is electrically connected to a supply voltage Vcc by interconnect while the right end is defined as the second output voltage V2. As for the lower-right resistive arm, the right end is electrically connected to the right end of the upper-right resistive arm as second output voltage V2 while the left end is electrically connected to ground by interconnect. As for the upper-left resistive arm, the right end is electrically connected to a supply voltage Vcc by interconnect while the left end is defined as first output voltage V1. As for lower-left resistive arm, the left end is electrically connected to the left end of the upper-left resistive arm as first output voltage V1 while the right end is electrically connected to ground by interconnect. The built-in self test unit has at least four U-shaped sub-units (upper-right sub-unit、 lower-right sub-unit、 upper-left sub-unit、 lower-left sub-unit) and these four U-shaped sub-units are disposed at the periphery of the four resistive arms of the Wheatstone bridge configuration respectively. Each U-shaped sub-unit is composed of two conductive parts 200 and an extension 210 at one end of these two conductive parts 200 to join them together. The right end of the upper-right U-shaped sub-unit is electrically connected to a high voltage level of the built-in self test unit BIST+ by interconnect while the left end is connected to the right end of the upper-left U-shaped sub-unit. The left end of the upper-left U-shaped sub-unit is connected to the left end of the lower-left U-shaped sub-unit by interconnect. The right end of the lower-left U-shaped sub-unit is connected to the left end of the lower-right U-shaped sub-unit by interconnect. The right end of the lower-right U-shaped sub-unit is electrically connected to a low voltage level of the built-in self test unit BIST− by interconnect. Thus, when an electrical current runs through the built-in self test unit, magnetic field of the same direction and strength would be formed at the inner sides of the four U-shaped sub-units (the sides closer to the Z-axis magnetoresistive sensing portions 800), resulting in a change of the combined resistance of the Z-axis magnetoresistive sensing portions 800 to achieve the purpose of self-testing. The built-in self test unit of this embodiment is composed of four U-shaped sub-units electrically connected in series, however it would be obvious to a person skilled in the art that the present invention is not limited thereto. The four U-shaped sub-units may be connected in parallel or other way to the high voltage level of the built-in self test unit BIST+ and the low voltage level of the built-in self test unit BIST−. Regardless of current directions of the conductive parts 200 and orientations of the Z-axis magnetoresistive sensing portions 800, two Z-axis magnetoresistive sensing portions 800 connected in series together with the corresponding conductive parts 200 and the extension of these conductive parts 200 form the array composed of the Z-axis magnetoresistive sensing cells 1000 and 1000' in FIG. 4. However, to achieve certain measuring purposes by operations of the Wheatstone bridge configuration it is possible to alter the orientations of the magnetoresistive layer 300 in FIG. 4 (disposed at left side or right side) and/or the orientations of the conductive strips 500 (disposed from left up to right down or from left down to right up).

Before using the built-in self test unit shown in FIG. 5 to test, calibrate or compensate the magnetoresistive sensing element of Wheatstone bridge configuration, a SET/RESET circuit 900 is optionally used to adjust the directions of the magnetizations of the first extension portions 400 of four resistive arms to predetermined directions. In this embodiment, the SET/RESET circuit 900 with a shape of horseshoe is located under the Wheatstone bridge configuration and the built-in self test unit and passes through all the Z-axis magnetoresistive sensing portions 800. The upper end of the SET/RESET circuit 900 is electrically connected to a high voltage level S/R+ while the lower end of the SET/RESET circuit 900 is electrically connected to a low voltage level S/R−. After adjustment by the SET/RESET circuit 900, the directions of the magnetizations of the first extension portions 400 of the Z-axis magnetoresistive sensing portions 800 of the upper-right and upper-left resistive arms go upward while directions of the magnetizations of the first extension portions 400 of the Z-axis magnetoresistive sensing portions 800 of the lower-right and lower-left resistive arms go downward. Afterward, applying a given voltage to the built-in self test unit and then a Z-axis magnetic field component would be generated and sensed by the magnetoresistive sensing element. Under the influence of this Z-axis magnetic field component, the resistance of the magnetoresistive sensing element changes, thereby generating a voltage difference between the first output voltage V1 and the second output voltage V2. Under such BIST diagnosis, the status of the magnetoresistive sensing element can be learned; if the test result is not satisfactory, a calibration or tuning procedure may be performed to the magnetoresistive sensing element to ensure accuracy and precision while operation.

Figure 6:
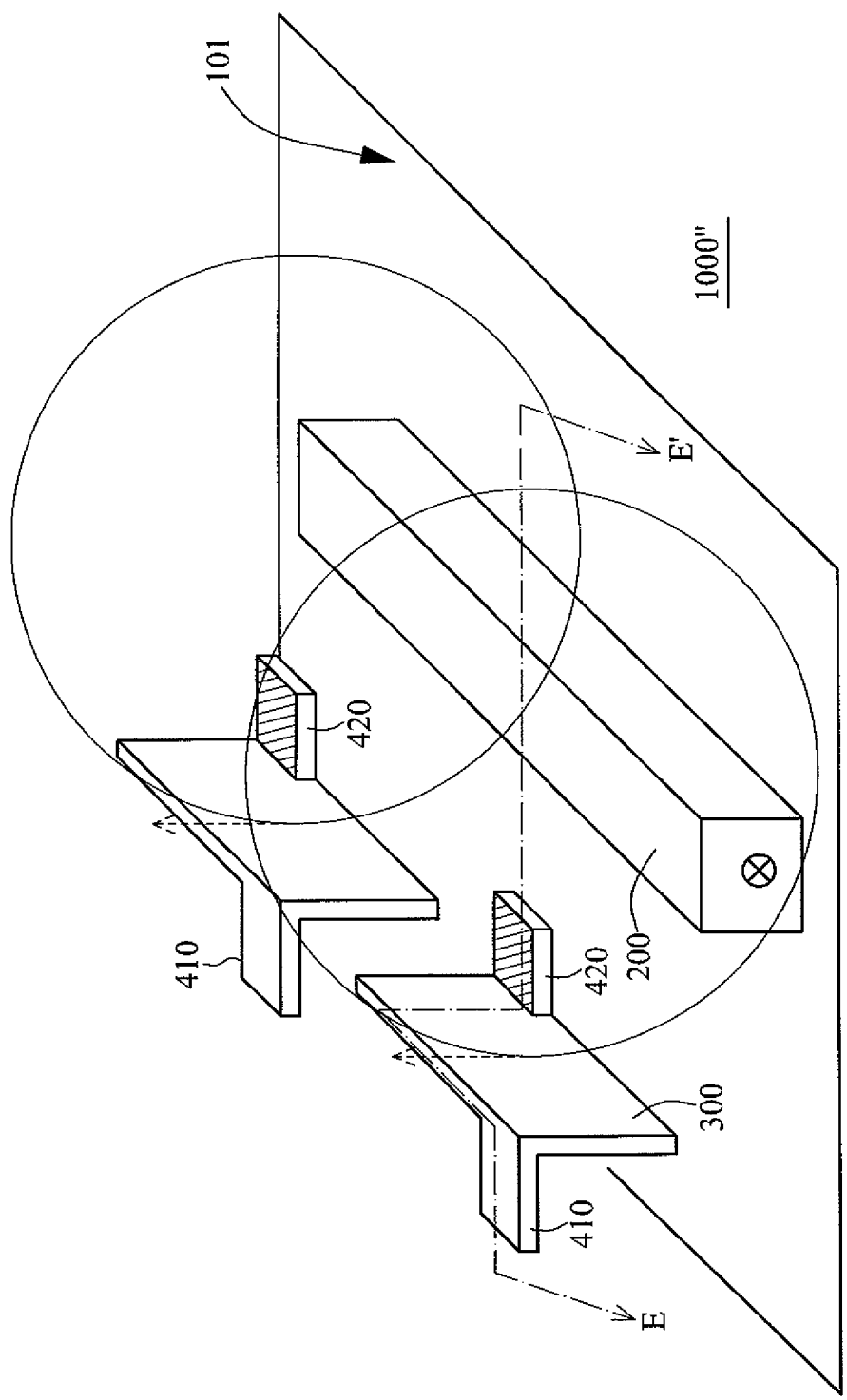
FIG. 6 is a detailed view of a Z-axis magnetoresistive sensing cell in accordance with an embodiment of the present invention.
Figure 6A:
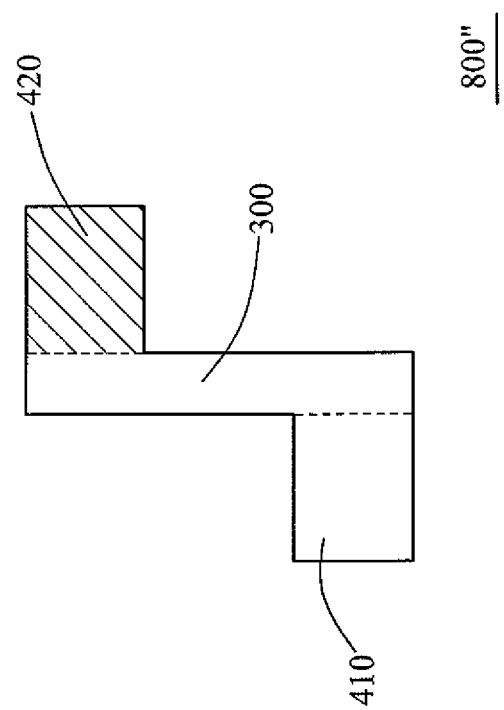
FIG. 6A is a top view of the magnetoresistive sensing portion of the Z-axis magnetoresistive sensing cell in accordance with an embodiment of the present invention shown in FIG. 6.
Figure 6A:
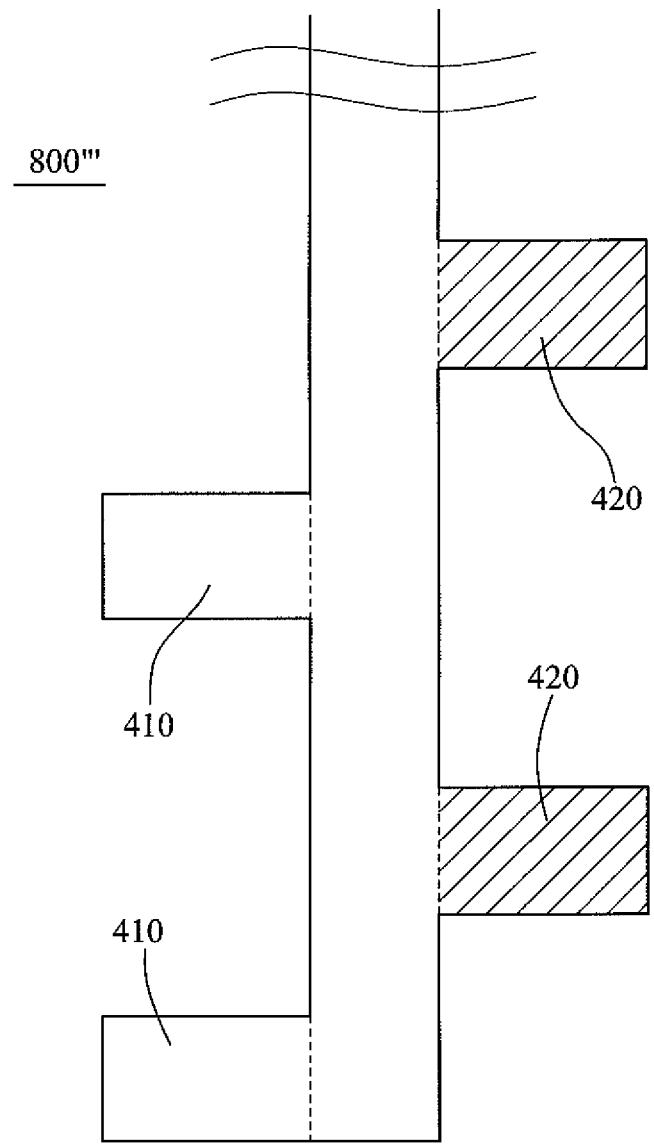

Next please refer to FIG. 6, FIG. 6A and FIG. 6a. FIG. 6 is a detailed view of a Z-axis magnetoresistive sensing cell 1000" in accordance with another embodiment of the present invention. FIG. 6A is a top view of the magnetoresistive sensing portion 800" of the Z-axis magnetoresistive sensing cell 1000" shown in FIG. 6. FIG. 6a illustrates a magnetoresistive sensing portion 800''' formed by connecting multiple magnetoresistive sensing portion 800" by one magnetoresistive layer 300. As shown in FIG. 6, Z-axis magnetoresistive sensing cell 1000" comprises the magnetoresistive layer 300 and the conductive part 200 shown in FIG. 1A-1C. The Z-axis magnetoresistive sensing cell 1000" further comprises a first extension portion 410 of the magnetoresistive layer 300 (referred to as first extension portion 410) and a second extension portion 420 of the magnetoresistive layer 300 (referred to as second extension portion 420). In one embodiment of present invention, the magnetoresistive layer 300, the first extension portion 410 and the second extension portion 420 constitute the Z-axis magnetoresistive sensing portion 800" shown in FIG. 6A. The magnetoresistive layer 300, the first extension portion 410 and the second extension portion 420 may be formed by the same magnetoresistive material into one structure or they may be formed by the same or different magnetoresistive materials into physically connected discrete structures. The magnetoresistive layer 300 is not parallel to the first surface 101, but the first extension portion 410 and the second extension portion 420 are substantially parallel to the first surface 101. As stated earlier, the primary function of the magnetoresistive layer 300 is to sense a Z-axis magnetic field perpendicular to the first surface 101. In this embodiment, since the magnetoresistive layer 300 is in physical contact with the first extension portion 410 and the second extension portion 420, the resistance change of the magnetoresistive layer 300 due to Z-axis magnetic field influence can be measured via the first extension portion 410 and the second extension portion 420 as terminals.

Although in this embodiment the Z-axis magnetoresistive sensing portions 800" are illustrated by multiple disconnected discrete structures, they are just used to simplify the figure and facilitate better understanding. Please refer to FIGS. 6B-6D for more real situation. Specifically, the first extension portion 410 and the second extension portion 420 of the magnetoresistive layer 300 would electrically connect to a first interconnect portion 710 and a second interconnect portion 720, respectively. And the first interconnect portions 710 of one Z-axis magnetoresistive sensing portion 800" is electrically connected to the second interconnect portion 720 from another Z-axis magnetoresistive sensing portion 800" by other interconnect. Now the electrical path within one Z-axis magnetoresistive sensing portion 800" would be starting from the first interconnect portion 710, sequentially through the first extension portion 410, the magnetoresistive layer 300, the second extension portion 420 and ending in the second interconnect portion 720.

Due to the placement of the first extension portion 410 and the second extension portion 420, a current flowing across the magnetoresistive layer 300 has a conducting direction not parallel to the length direction of the magnetoresistive layer 300 (the shortest current path between the first extension portion 410 and second extension portion 420 is not parallel to the length direction of the magnetoresistive layer 300). Hence in this embodiment no conductive strips 500 are required to alter the conducting direction of the electrical current flowing in the magnetoresistive layer 300. The conducting direction of the electrical current flowing in the magnetoresistive layer 300 preferably forms a 45 degree angle with respect to the length direction of the magnetoresistive layer 300. In this embodiment, the current flowing in the conductive part 200 flows straight into the paper so as to create a clockwise magnetic field, a Z-axis component of this magnetic field would be sensed by a magnetoresistive layer 300 close to the conductive part 200, changing the magnetization direction of the magnetoresistive layer 300 and hence the angle with the current conducting direction, thereby resulting in a resistance change of the magnetoresistive layer 300. In this embodiment, the length of the magnetoresistive layer 300 is greater than the length of the first extension portion 410 or the length of the second extension portion 420; the conductive part 200 corresponds to multiple magnetoresistive layers 300 so the length of the conductive part 200 is much greater than the length of single magnetoresistive layer 300. In the embodiment shown in FIG. 6A each Z-axis magnetoresistive sensing portion 800" has its corresponding magnetoresistive layer 300, but in the embodiment shown in FIG. 6a multiple Z-axis magnetoresistive sensing portions 800" share one magnetoresistive layer 300 to form a Z-axis magnetoresistive sensing portions

800'. Since the working principle of the Z-axis magnetoresistive sensing portions 800''' of FIG. 6a is similar to the one of the Z-axis magnetoresistive sensing portions 800'' of 6A, it is omitted to avoid repetitions.

Figure 6B:
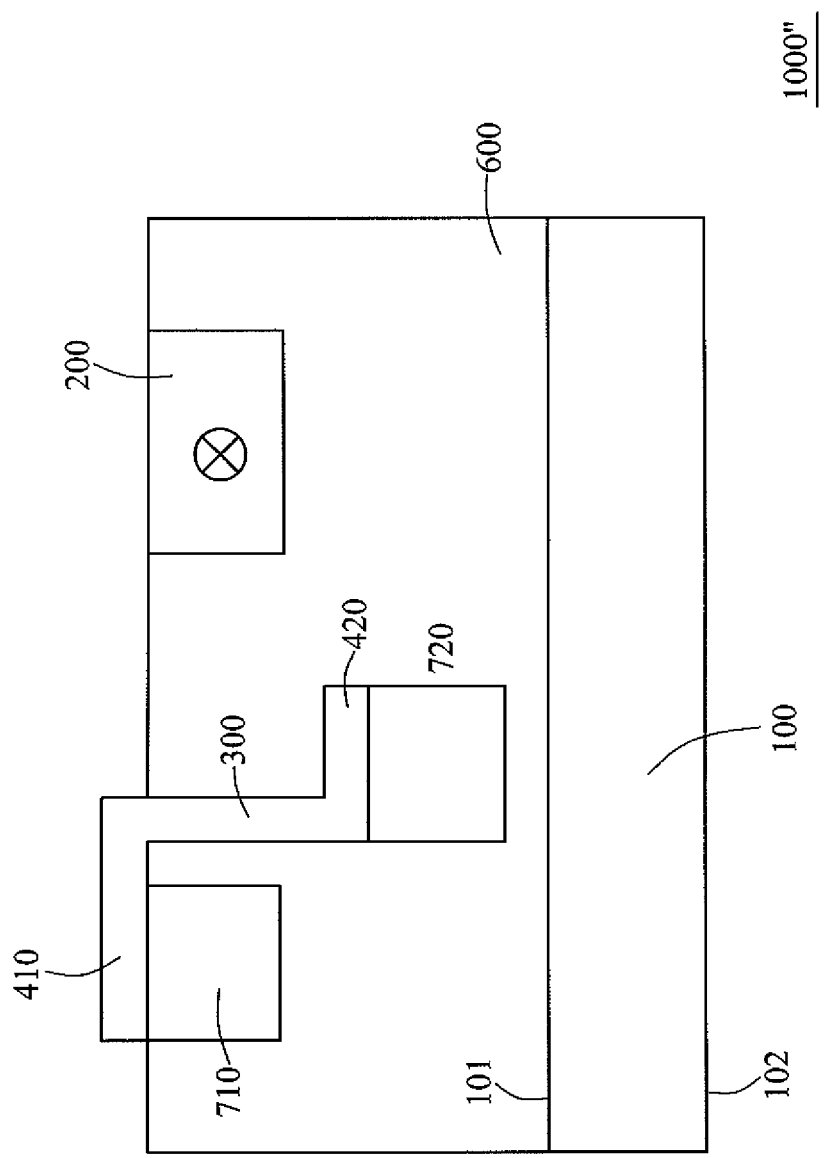
FIG. 6B is a cross sectional view of a Z-axis magnetoresistive sensing cell in accordance with an embodiment of the present invention.
Figure 6C:
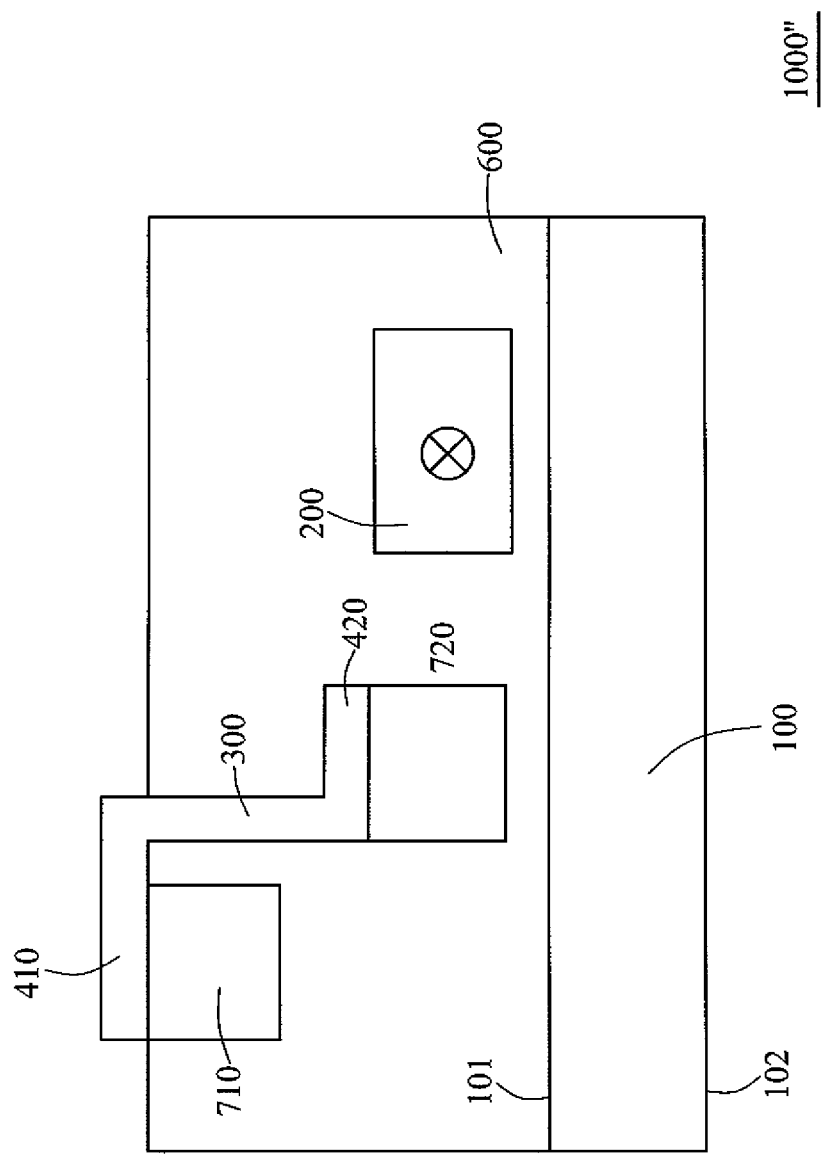
FIG. 6C is a cross sectional view of a Z-axis magnetoresistive sensing cell in accordance with another embodiment of the present invention.
Figure 6D:
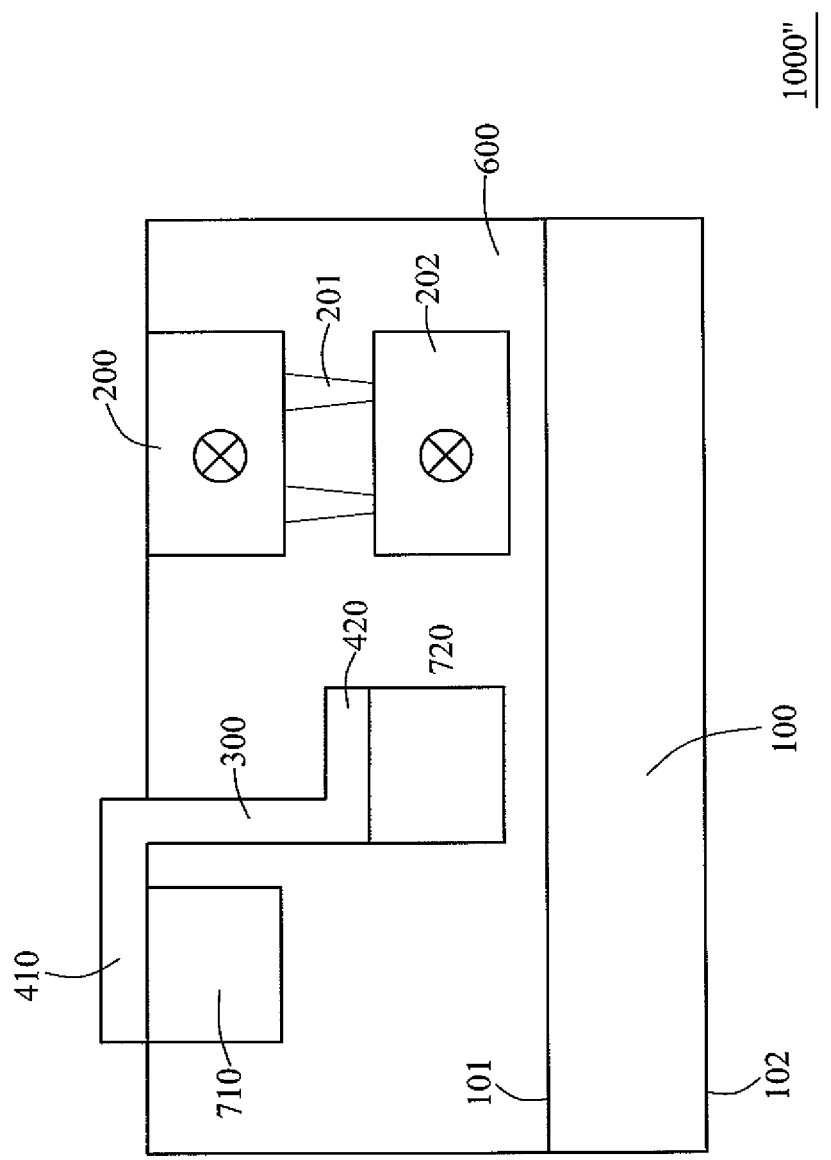
FIG. 6D is a cross sectional view of a Z-axis magnetoresistive sensing cell in accordance with yet another embodiment of the present invention.

Next please refer to FIGS. 6B-6D. FIGS. 6B-6D show cross sectional views of the Z-axis magnetoresistive sensing cells 1000'' of different embodiments taken along cutting line E-E'. In FIGS. 6B-6D, although the magnetoresistive layer 300 the first extension portion 410 and the second extension portion 420 are formed into one structure, they can be physically connected discrete structures. Although the magnetoresistive layer 300, the conductive part 200, the second extension portion 420, the first interconnect portion 710 and the second interconnect portion 720 are disposed in the dielectric layer 600 above the substrate 100 and the first extension portion 410 is disposed on the dielectric layer 600, there may be more dielectric layers covering and protecting the first extension portion 410 and other devices or circuitry. The dielectric layer 600 can be a single-layered or multiple-layered structure of the same material or different materials. In FIG. 6B, the conductive part 200 is substantially at the same level with the Z-axis magnetoresistive sensing portion 800''. In FIG. 6C, the conductive part 202 is slightly below the Z-axis magnetoresistive sensing portion 800''. In FIG. 6D, the conductive part 200 combines with the conductive part 202 slightly below the Z-axis magnetoresistive sensing portion 800'' together to become a magnetic field generating source and the conductive part 200 and the conductive part 202 are electrically connected by the conductive contact/via 201. The conductive part 200, the conductive part 202 and the conductive contact/via 201 may be formed into one structure or physically connected discrete structures of the same material or different materials. Even though not shown in the figures, similarly the conductive part 202 may be slightly higher than the Z-axis magnetoresistive sensing portion 800'' and electrically connected the conductive part 200 by the conductive contact/via 201.

In FIGS. 6B-6D, the first interconnect portion 710 and the second interconnect portion 720 are physically connected to the first extension portion 410 and the second extension portion 420 respectively, and the first extension portions 410 and second extension portions 420 from different Z-axis magnetoresistive sensing portions 800'' are electrically connected by other interconnect, so the first interconnect portion 710 and the second interconnect portion 720 are not only means to introduce electrical current into the Z-axis magnetoresistive sensing portion 800'' but also means to electrically connect different Z-axis magnetoresistive sensing portions 800''. Even though the first interconnect portion 710 and the second interconnect portion 720 are illustrated by rectangles, they may be a structure of an arbitrary combination of metal layers, metal contacts, metal via, through via . . . etc. in any number and arranged in any way.

Figure 7:
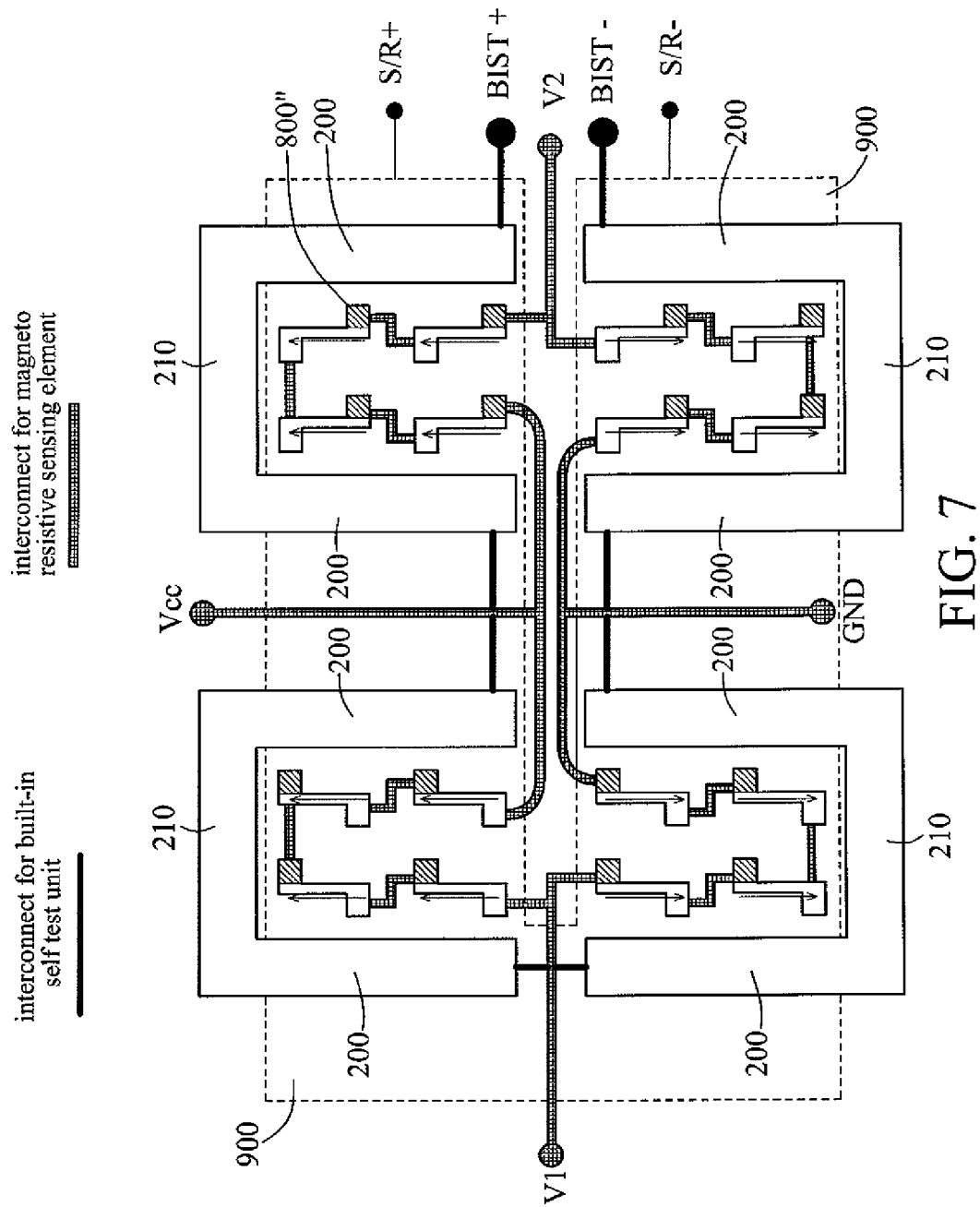
FIG. 7 illustrates the circuit topology of an integrated magnetoresistive sensing device in accordance with another embodiment of the present invention, wherein the integrated magnetoresistive sensing device comprises a magnetoresistive sensing element of Wheatstone bridge configuration and a built-in self test unit (BIST)

FIG. 7 illustrates the circuit topology of an integrated magnetoresistive sensing device in accordance with another embodiment of the present invention, wherein the integrated magnetoresistive sensing device comprises a magnetoresistive sensing element of Wheatstone bridge configuration and a built-in self test unit (BIST). The integrated magnetoresistive sensing devices in FIG. 7 and FIG. 5 behave the same way in architecture, function and operation, except each Z-axis magnetoresistive sensing portion 800 in FIG. 5 is replaced by multiple Z-axis magnetoresistive sensing portions 800'' (for example two Z-axis magnetoresistive portions 800'') in serial connections. So similar description is omitted here. In another embodiment, each Z-axis magnetoresistive sensing portion 800 in FIG. 5 may be replaced by multiple Z-axis magnetoresistive sensing portions 800''.

Figure 8:
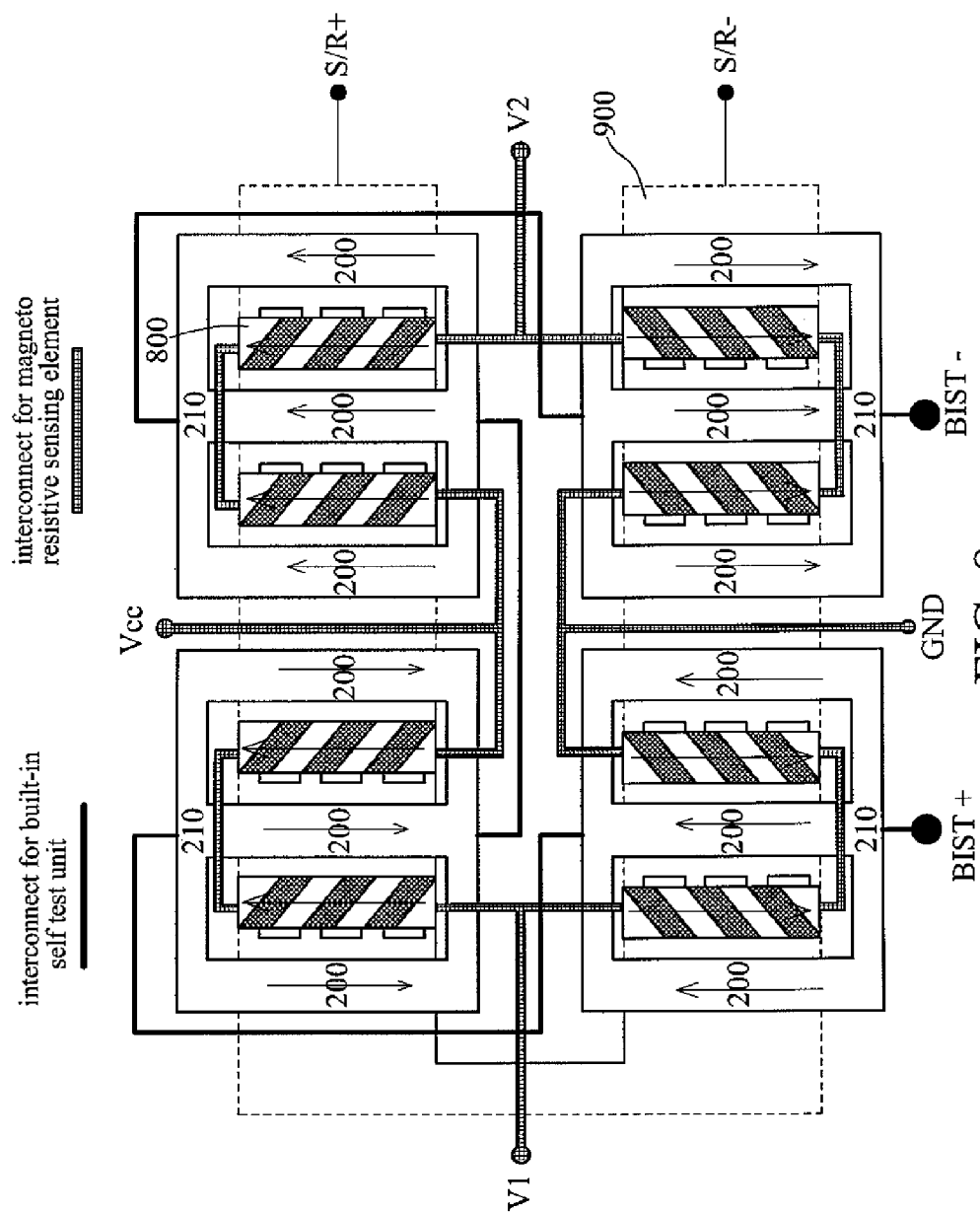
FIG. 8 illustrates the circuit topology of an integrated magnetoresistive sensing device in accordance with another embodiment of the present invention, wherein the integrated magnetoresistive sensing device comprises a magnetoresistive sensing element of Wheatstone bridge configuration and a built-in self test unit (BIST)

FIG. 8 illustrates the circuit topology of an integrated magnetoresistive sensing device in accordance with another embodiment of the present invention, wherein the integrated magnetoresistive sensing device comprises a magnetoresistive sensing element of Wheatstone bridge configuration and a built-in self test unit (BIST). The integrated magnetoresistive sensing devices in FIG. 8 and FIG. 5 both comprise a similar magnetoresistive sensing element in Wheatstone bridge configuration, and a similar horseshoe shaped SET/RESET circuit 900 passing under all the Z-axis magnetoresistive sensing portions 800. The major difference lies on the structure of the built-in self test unit. In the embodiment of FIG. 8, the built-in self test unit comprises four gratings and each grating corresponds to one of the four resistive arms of the Wheatstone bridge configuration. This grating is composed of multiple conductive parts 200 (exemplified by three in this embodiment, but may be more or less) and two extensions 210 at two ends of the multiple conductive parts 200 to connect them together. All the Z-axis magnetoresistive sensing portions 800 are surrounded by the outer frame of the grating. Every Z-axis magnetoresistive sensing portion 800 has one conductive part 200 disposed at its either side.

The four gratings in this embodiment are connected in series. To make sure all the magnetoresistive layers 300 of all the Z-axis magnetoresistive sensing portions 800 sense the same generated Z-axis magnetic field in amplitude and direction, the connection sequence between four gratings has to be properly made. The upper end of the upper-right grating is connected to the upper end of the lower-right grating by interconnect, the lower end of the upper-right grating is connected to the lower end of the upper-left grating, the upper end of the upper-left grating is connected to the upper end of the lower-left grating by interconnect, and the lower end of the lower-left grating is electrically connected to a high voltage level of the built-in self test unit BIST+ while the lower end of the lower-right grating is electrically connected to a low voltage level of the built-in self test unit BIST−. Due to the complexity of connections, all the conducting directions of all the electrical currents flowing in all the conductive parts 200 are marked by arrows in FIG. 8. Although the built-in self test unit of this embodiment is composed of four gratings electrically connected in series, however it would be obvious to a person skilled in the art that the present invention is not limited thereto. The four gratings may be connected in parallel or other way to the high voltage level of the built-in self test unit BIST+ and the low voltage level of the built-in self test unit BIST−.

Before using the built-in self test unit shown in FIG. 8 to test, calibrate or compensate the magnetoresistive sensing element of Wheatstone bridge configuration, a SET/RESET circuit 900 is optionally used to adjust directions of the magnetizations of the first extension portions 400 of four resistive arms to predetermined directions. In this embodiment after adjustment by the SET/RESET circuit 900, directions of the magnetizations of the first extension portions 400 of the Z-axis magnetoresistive sensing portions 800 of the upper-right and upper-left resistive arms go upward while directions of the magnetizations of the first extension portions 400 of the Z-axis magnetoresistive sensing portions 800 of the lower-right and lower-left resistive arms go downward.

Figure 9:
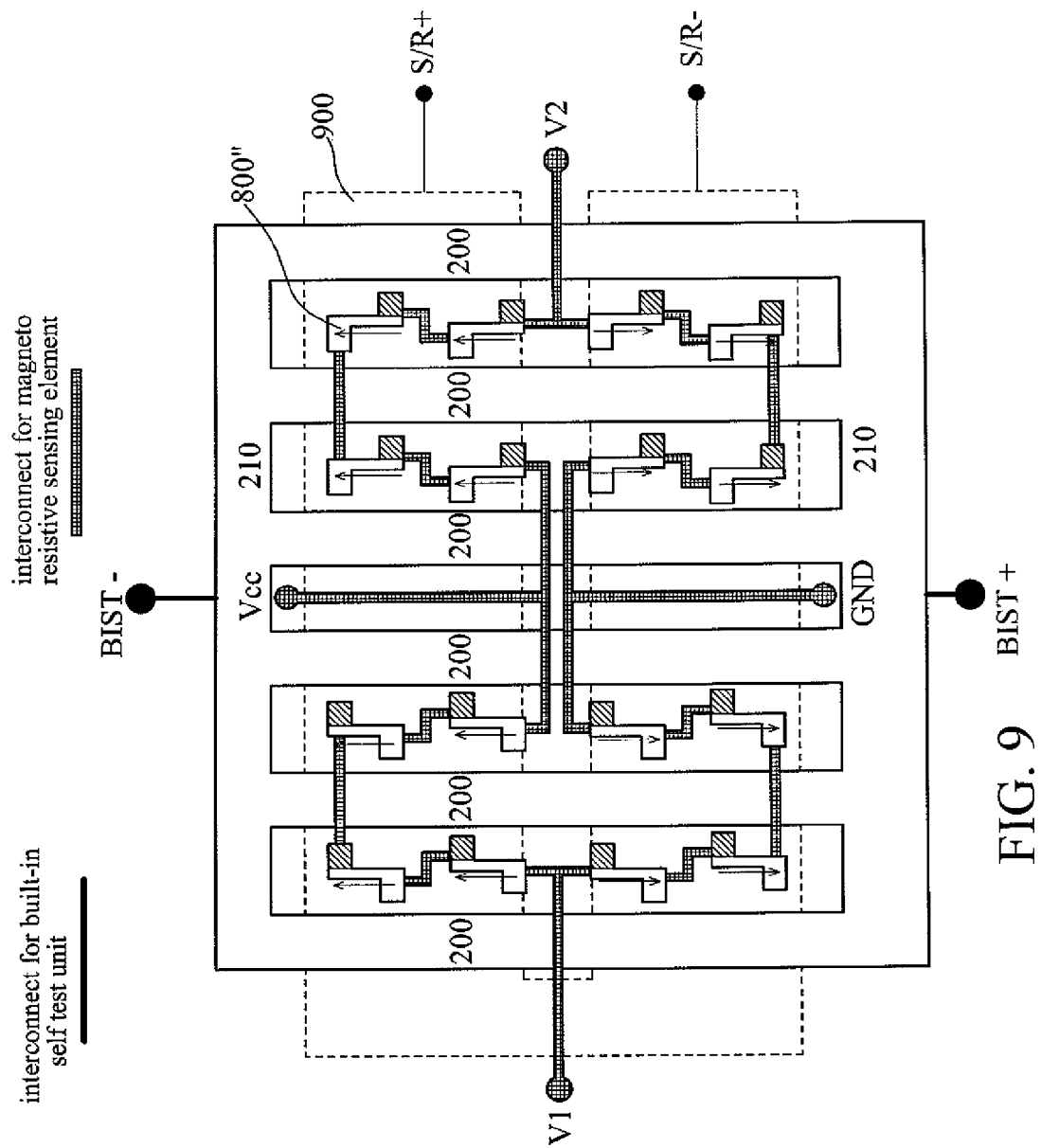
FIG. 9 illustrates the circuit topology of an integrated magnetoresistive sensing device in accordance with another embodiment of the present invention, wherein the integrated magnetoresistive sensing device comprises a magnetoresistive sensing element of Wheatstone bridge configuration and a built-in self test unit (BIST).

FIG. 9 illustrates the circuit topology of an integrated magnetoresistive sensing device in accordance with another embodiment of the present invention, wherein the integrated magnetoresistive sensing device comprises a magnetoresistive sensing element of Wheatstone bridge configuration and a built-in self test unit (BIST). The integrated magnetoresistive sensing devices in FIG. 9 and FIG. 7 both comprise a similar magnetoresistive sensing element in Wheatstone bridge configuration, and a similar horseshoe shaped SET/RESET circuit 900 passing under all the Z-axis magnetoresistive sensing portions 800". The major difference lies on the structure of the built-in self test unit. In the embodiment of FIG. 9, the built-in self test unit is a grating enclosing all the resistive arms of the Wheatstone bridge configuration and this grating comprises multiple conductive parts 200 (exemplified by six in this embodiment, but can be more or less) and two extensions 210 at two ends of the multiple conductive parts 200 to connect them together. The upper extension 210 is electrically connected to a low voltage level of the built-in self test unit BIST− and the lower extension 210 is electrically connected to a high voltage level of the built-in self test unit BIST+. In this embodiment, all the Z-axis magnetoresistive sensing portions 800" are surrounded by the frame of the grating, and each Z-axis magnetoresistive sensing portion 800" has two conductive parts 200 at its both sides, respectively. In another embodiment, each Z-axis magnetoresistive sensing portions 800" may be replaced by Z-axis magnetoresistive sensing portions 800'".

Before using the built-in self test unit shown in FIG. 9 to test, calibrate or compensate the magnetoresistive sensing element of Wheatstone bridge configuration, a SET/RESET circuit 900 is optionally used to adjust directions of the magnetizations of the magnetoresistive layers 300 of four resistive arms to predetermined directions (as shown by the arrows marked on the magnetoresistive layers 300). In this embodiment after adjustment by the SET/RESET circuit 900, directions of the magnetizations of the magnetoresistive layers 300 of the Z-axis magnetoresistive sensing portions 800" of the upper-right and upper-left resistive arms are from down to up while directions of the magnetizations of the magnetoresistive layers 300 of the Z-axis magnetoresistive sensing portions 800" of the lower right and lower left resistive arms are from up to down.

Although FIGS. 5, 7, 8 and 9 show the circuit topologies of integrated magnetoresistive sensing devices in accordance with the present invention, it should be noted that a magnetoresistive sensing element is a device capable of sensing a change on the magnetic field and it is not necessarily adopting Wheatstone bridge configuration as its structure. The focus of FIGS. 5, 7, 8 and 9 is that the built-in self test unit (BIST, under this context it means all the conductive parts 200 and their extensions 210 not including interconnect thereof) are disposed at the periphery area of the magnetoresistive sensing element or areas within the magnetoresistive sensing element but not disposed right under the magnetoresistive sensing element, so in a top view a projection of the built-in self test unit on the first surface 101 does not overlap with a projection of the magnetoresistive sensing element on the first surface 101. Especially, a projection of the conductive parts 200 on the first surface 101 does not overlap with a projection of the magnetoresistive layers on the first surface 101. A person skilled in the art should understand that since different U-shaped sub-units or different gratings may be electrically connected by interconnects above or below them, these interconnects may cross over or under the magnetoresistive sensing element and in this situation a projection of these interconnects on the first surface 101 may overlap with a projection of the magnetoresistive sensing element on the first surface 101.

Furthermore, another focus of this invention is the magnetoresistive layers 300 not parallel to the first surface 101. As long as they are capable of sensing a Z-axis magnetic field perpendicular to the first surface 101, their shapes and topologies are not limited to those shown or mentioned here. They may take a form of a vertical portion of a magnetoresistive layer on the sidewall of a circular or rectangular trench. If they are integrated with a magnetoresistive sensing element capable of sensing X-axis/Y-axis magnetic field that is parallel to the surface of the substrate, package complexity and size of the final sensing product can be significantly reduced.

While the invention has been described in terms of what is presently considered to be the most practical and preferred embodiments, it is to be understood that the invention needs not be limited to the disclosed embodiment. On the contrary, it is intended to cover various modifications and similar topology included within the spirit and scope of the appended claims which are to be accorded with the broadest interpretation so as to encompass all such modifications and similar structures.

What is claimed is:

1. An integrated magnetoresistive sensing device, comprising:
   a substrate, having a first surface and a second surface opposite to the first surface;
   a magnetoresistive sensing element, disposed above the first surface and having at least a magnetoresistive layer not parallel to the first surface; and
   a built-in self test (BIST) unit, disposed above the first surface and having at least a conductive part corresponding to the magnetoresistive layer, wherein the conductive part is configured to generate a magnetic field along a direction perpendicular to the first surface,
   wherein a projection of the conductive part on the first surface does not overlap with a projection of the magnetoresistive layer on the first surface, and the magnetoresistive layer has a thickness, a width and a length, the length is greater than the width and the width is greater than the thickness, and a direction of the width is not parallel to the first surface; and the conductive part has a thickness, a width and a length, the length is greater than the width and greater than the thickness, and a direction of the length is parallel to the direction of length of the magnetoresistive layer.

2. The integrated magnetoresistive sensing device of claim 1, wherein the magnetoresistive layer comprises an anisotropic magnetoresistance (AMR) material.

3. The integrated magnetoresistive sensing device of claim 1, wherein a resistance of the magnetoresistive layer changes along with a external magnetic field, and the magnetoresistive layer comprises ferromagnet material, antiferromagnet, non-ferromagnet material, tunneling oxide or any combination thereof.

4. The integrated magnetoresistive sensing device of claim 1, wherein a direction of the width of the magnetoresistive layer is substantially perpendicular to the first surface.

5. The integrated magnetoresistive sensing device of claim 1, wherein the conductive part is slightly higher or slightly lower than the magnetoresistive layer or substantially at the same level with the magnetoresistive layer.

6. The integrated magnetoresistive sensing device of claim 1, wherein the magnetoresistive layer has a first extension portion, and this first extension portion is substantially parallel to the first surface.

7. The integrated magnetoresistive sensing device of claim 6, wherein a length of the first extension portion is substantially equivalent to the length of the magnetoresistive layer.

8. The integrated magnetoresistive sensing device of claim 7, wherein the first extension portion is physically connected to a plurality of conductive strips, a direction of a length of the conductive strip is not parallel to a direction of the length of the first extension portion.

9. The integrated magnetoresistive sensing device of claim 8, wherein the plurality of conductive strips are disposed above or below the first extension portion.

10. The integrated magnetoresistive sensing device of claim 6, wherein a length of the first extension portion is greater than the length of the magnetoresistive layer.

11. The integrated magnetoresistive sensing device of claim 10, wherein the first extension portion is electrically connected to a plurality of the magnetoresistive layers.

12. The integrated magnetoresistive sensing device of claim 6, wherein a length of the first extension portion is smaller than the length of the magnetoresistive layer.

13. The integrated magnetoresistive sensing device of claim 12, wherein
the magnetoresistive layer further comprises a second extension portion, this second extension portion is substantially parallel to the first surface; and
a first distance between the first extension portion and the first surface is greater than a second distance between the second extension portion and the first surface.

14. The integrated magnetoresistive sensing device of claim 13, wherein the first extension portion and the second extension portion protrude from the magnetoresistive layer along opposite directions.

15. The integrated magnetoresistive sensing device of claim 13, wherein the first extension portion and the second extension portion are connected to a first interconnect portion and a second interconnect portion respectively.

16. The integrated magnetoresistive sensing device of claim 15, wherein the first interconnect portion, the first extension portion, the magnetoresistive layer, the second extension portion and the second interconnect portion form a current path such that the conducting direction in the magnetoresistive layer is not parallel to the direction of the length of the magnetoresistive layer.

17. The integrated magnetoresistive sensing device of claim 16, wherein the conducting direction in the magnetoresistive layer forms a substantially 45 degree angle with respect to the direction of the length of the magnetoresistive layer.

18. The integrated magnetoresistive sensing device of claim 1, wherein the magnetoresistive layer and the conductive part are disposed repeatedly along a direction parallel to the first surface, wherein the conductive parts are connected in parallel so as to form a grating of the built-in self test (BIST) unit.

19. The integrated magnetoresistive sensing device of claim 1, further comprises:
another magnetoresistive layer and another conductive part corresponding to the another magnetoresistive layer,
wherein the conductive part is disposed at the first side, the another conductive part is disposed at the second side of the another magnetoresistive layer opposite to the first side, and the conductive part and the another conductive part are connected in serial so as to form an U-shaped sub-unit of the built-in self test (BIST) unit.

20. The integrated magnetoresistive sensing device of claim 1, wherein the magnetoresistive sensing element has a Wheatstone bridge configuration, and the Wheatstone bridge configuration has four resistive arms.

21. An integrated magnetoresistive sensing device, comprising:
a substrate, having a first surface and a second surface opposite to the first surface;
a magnetoresistive sensing element, disposed above the first surface and having at least a magnetoresistive layer not parallel to the first surface, wherein the magnetoresistive sensing element has a Wheatstone bridge configuration, and the Wheatstone bridge configuration has four resistive arms; and
a built-in self test (BIST) unit, disposed above the first surface and having at least a conductive part corresponding to the magnetoresistive layer, wherein the conductive part is configured to generate a magnetic field along a direction perpendicular to the first surface,
wherein the built-in self test (BIST) unit has at least four U-shaped sub-units, these four U-shaped sub-units correspond to the four resistive arms respectively.

22. The integrated magnetoresistive sensing device of claim 21, wherein the four U-shaped sub-units of the built-in self test (BIST) unit are connected in serial.

23. An integrated magnetoresistive sensing device, comprising:
a substrate, having a first surface and a second surface opposite to the first surface;
a magnetoresistive sensing element, disposed above the first surface and having a Wheatstone bridge configuration;
a built-in self test (BIST) unit, disposed above the first surface and having at least a conductive part at the periphery of the Wheatstone bridge configuration, wherein the conductive part is configured to generate a magnetic field along a direction perpendicular to the first surface,
wherein a projection of the conductive part on the first surface does not overlap with a projection of the Wheatstone bridge configuration on the first surface, and the Wheatstone bridge configuration has four resistive arms and each resistive arm comprises at least a magnetoresistive layer not parallel to the first surface, and the built-in self test (BIST) unit has at least four U-shaped sub-units, these four U-shaped sub-units correspond to the four resistive arms respectively.

24. The integrated magnetoresistive sensing device of claim 23, wherein the four U-shaped sub-units of the built-in self test (BIST) unit are connected in serial.

25. The integrated magnetoresistive sensing device of claim 23, wherein the built-in self test (BIST) unit has at least one grating and the resistive arms are surrounded by a frame of the grating.

* * * * *